United States Patent
Bernard et al.

(10) Patent No.: US 8,039,332 B2
(45) Date of Patent: Oct. 18, 2011

(54) METHOD OF MANUFACTURING A BURIED-GATE SEMICONDUCTOR DEVICE AND CORRESPONDING INTEGRATED CIRCUIT

(75) Inventors: Emilie Bernard, Grenoble (FR);
Bernard Guillaumot, Le Fontanil (FR);
Philippe Coronel, Barraux (FR);
Christian Vizioz, Saint Pierre de Mesage (FR)

(73) Assignees: STMicroelectronics (Crolles 2) SAS, Crolles Cedex (FR);
STMicroelectronics (Grenoble) SAS, Grenoble (FR); Commissariat a l'Energie Atomique, Paris (FR)

( * ) Notice: Subject to any disclaimer, the term of this patent is extended or adjusted under 35 U.S.C. 154(b) by 204 days.

(21) Appl. No.: 12/370,304

(22) Filed: Feb. 12, 2009

(65) Prior Publication Data
US 2009/0212333 A1    Aug. 27, 2009

(30) Foreign Application Priority Data
Feb. 27, 2008   (FR) ...................................... 08 51265

(51) Int. Cl.
*H01L 21/8234*    (2006.01)
(52) U.S. Cl. .. 438/197; 438/257; 438/282; 257/E21.409
(58) Field of Classification Search .................. 438/197, 438/257, 282; 257/E21.409
See application file for complete search history.

(56) References Cited

U.S. PATENT DOCUMENTS

| | | | |
|---|---|---|---|
| 4,803,539 A | 2/1989 | Psaras et al. | |
| 6,661,044 B2 | 12/2003 | Jang | |
| 6,864,129 B2 | 3/2005 | Risch et al. | |
| 2003/0054637 A1 | 3/2003 | Yang | |
| 2004/0124468 A1 | 7/2004 | Coronel et al. | |
| 2004/0262690 A1 | 12/2004 | Coronel et al. | |
| 2005/0029603 A1 | 2/2005 | Yu et al. | |
| 2005/0121703 A1 | 6/2005 | Hieda et al. | |
| 2005/0176186 A1 | 8/2005 | Lee et al. | |
| 2005/0224889 A1 | 10/2005 | Oh et al. | |
| 2005/0266645 A1 | 12/2005 | Park | |
| 2006/0024874 A1 | 2/2006 | Yun et al. | |
| 2007/0181959 A1 | 8/2007 | Park et al. | |
| 2009/0315182 A1 | 12/2009 | Besser et al. | |

FOREIGN PATENT DOCUMENTS

| DE | 199 28 564 A1 | 1/2001 |
|---|---|---|
| FR | 2 853 454 A1 | 10/2004 |
| JP | 2006278369 A | 10/2006 |

OTHER PUBLICATIONS

French Search Report, FR 0851265, dated Oct. 24, 2008 (2 pages).

*Primary Examiner* — Evan Pert
(74) *Attorney, Agent, or Firm* — Gardere Wynne Sewell LLP

(57) ABSTRACT

A semiconductor device includes a semiconductor channel region and a gate region, wherein the gate region includes at least one buried part extending under the channel region. The buried part of the gate region is formed from a cavity under the channel region. The cavity is filled with a first material. An opening is made to access the first material. In one implementation, aluminium is deposited in the opening in contact with the first material. An anneal is performed to cause the aluminium to be substituted for the first material in the cavity. In another implementation, a second material different from the first material is deposited in the opening. An anneal is performed to cause an alloy of the first and second materials to be formed in the cavity.

15 Claims, 21 Drawing Sheets

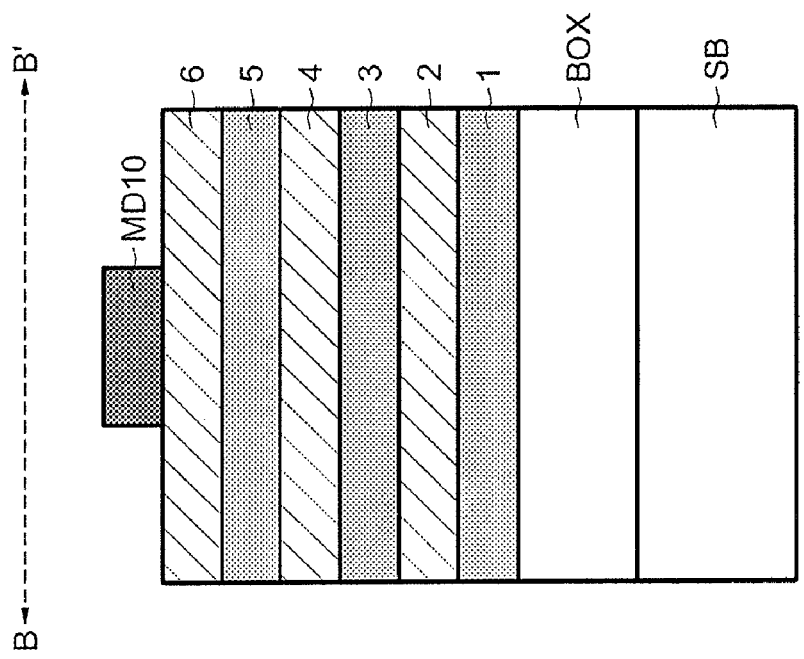
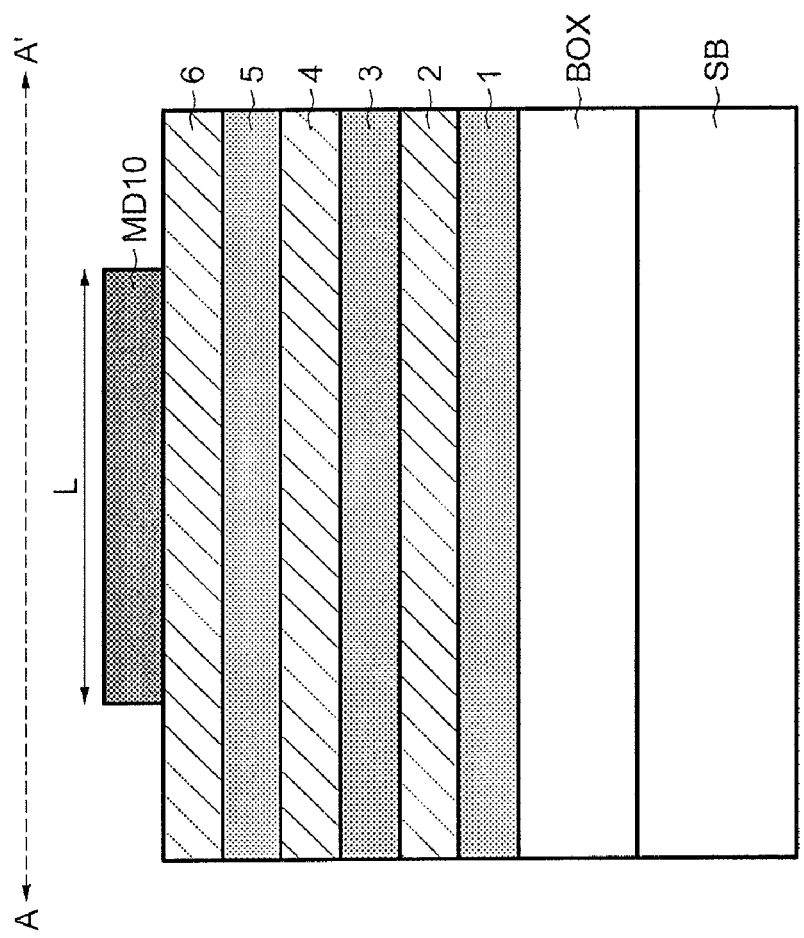

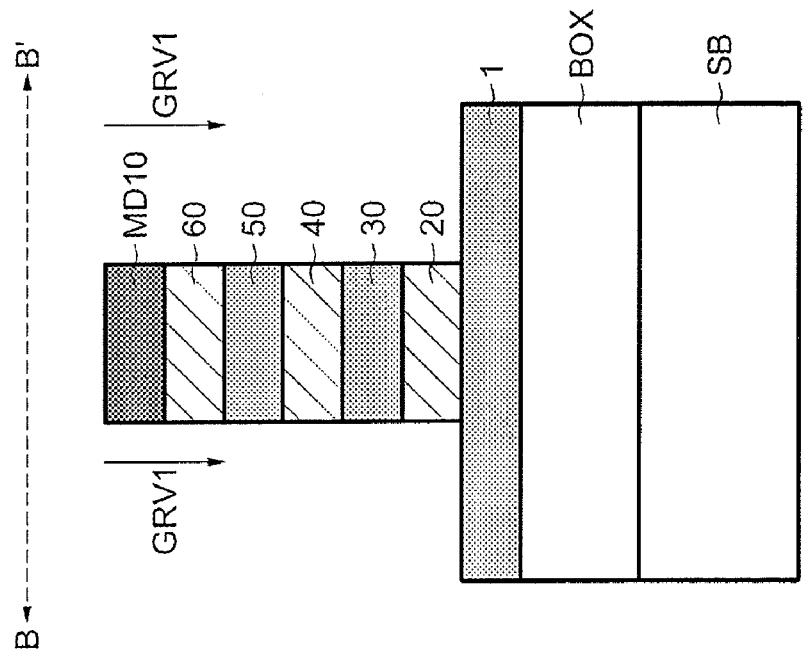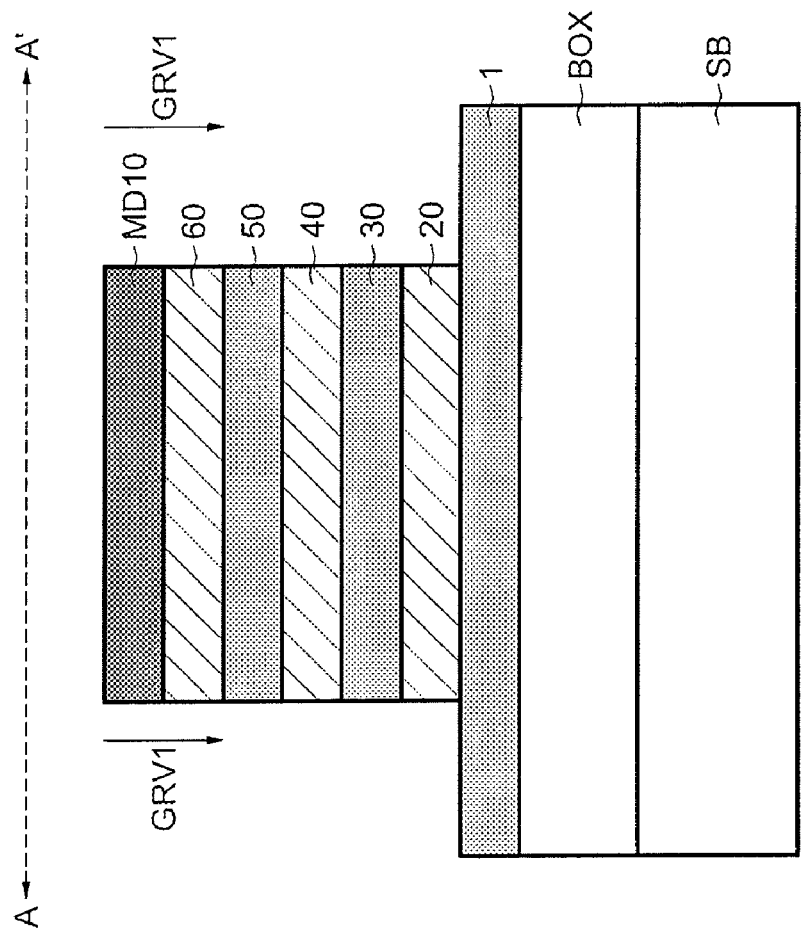

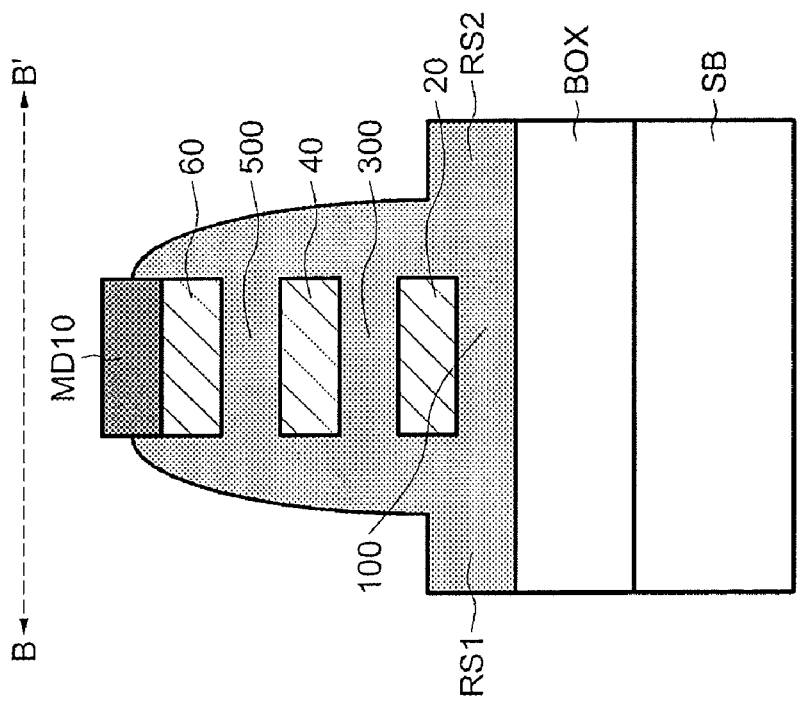
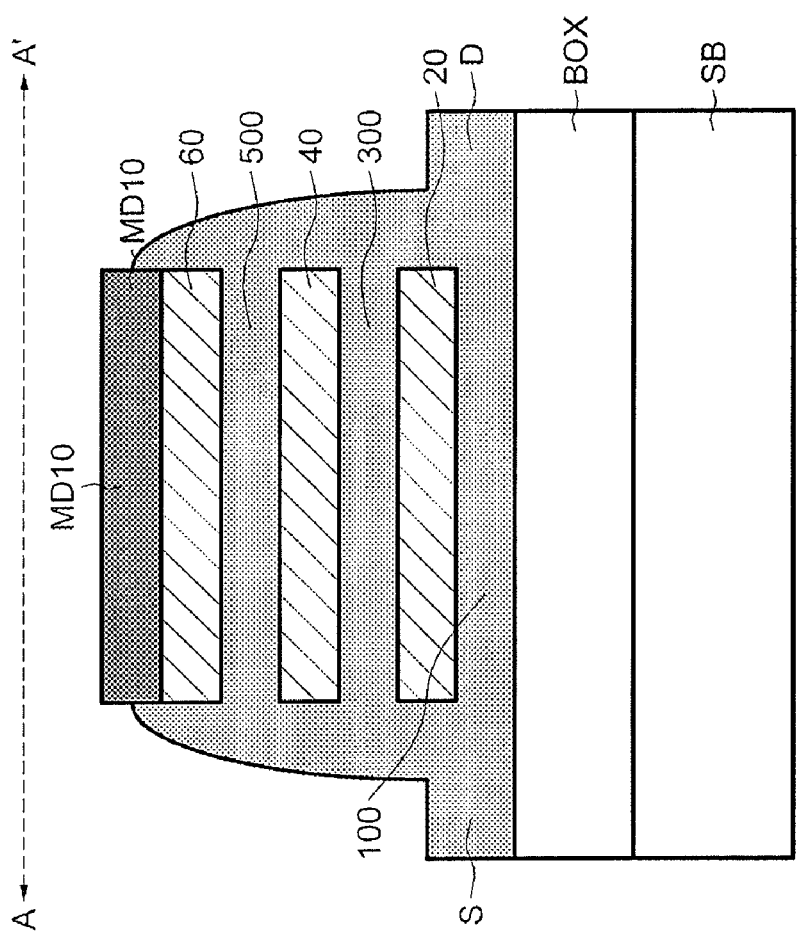
FIG.5a
FIG.5b

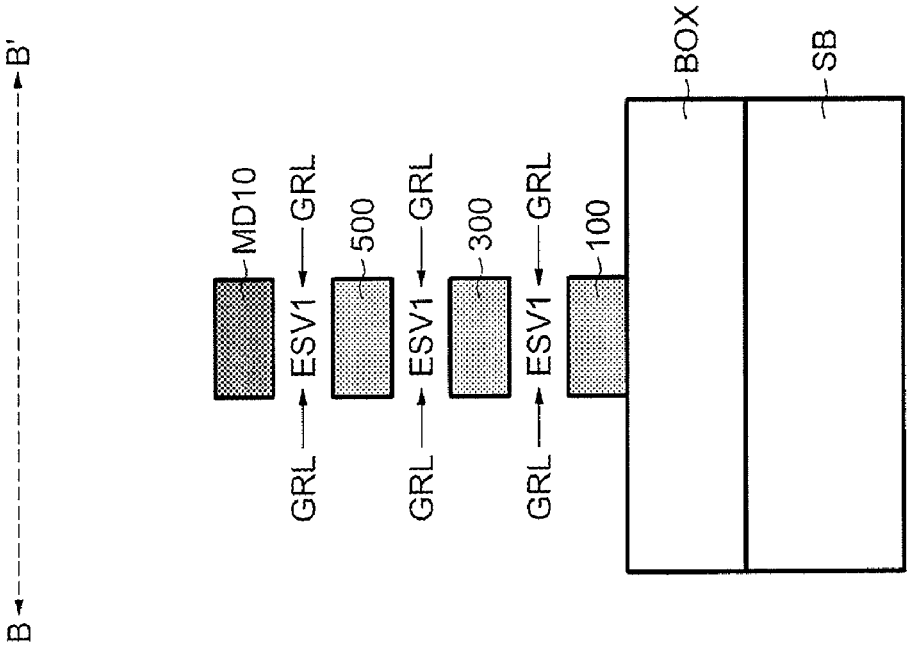
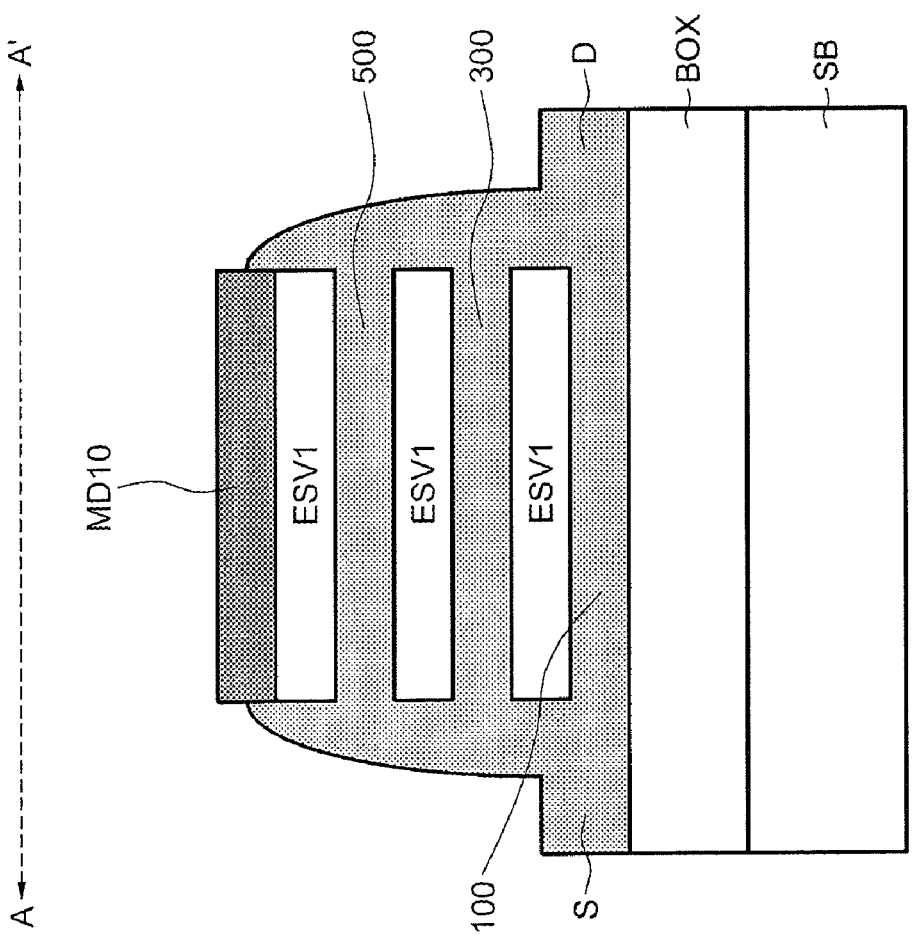

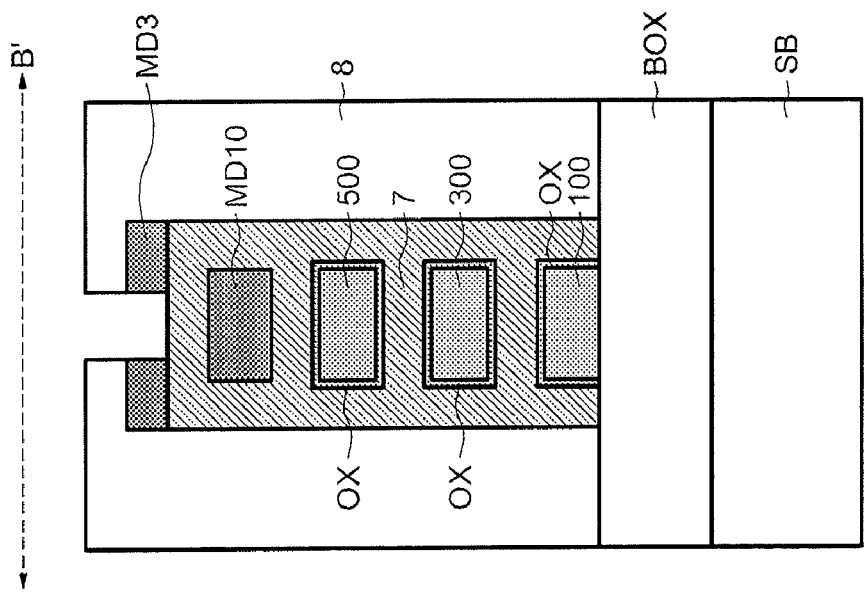
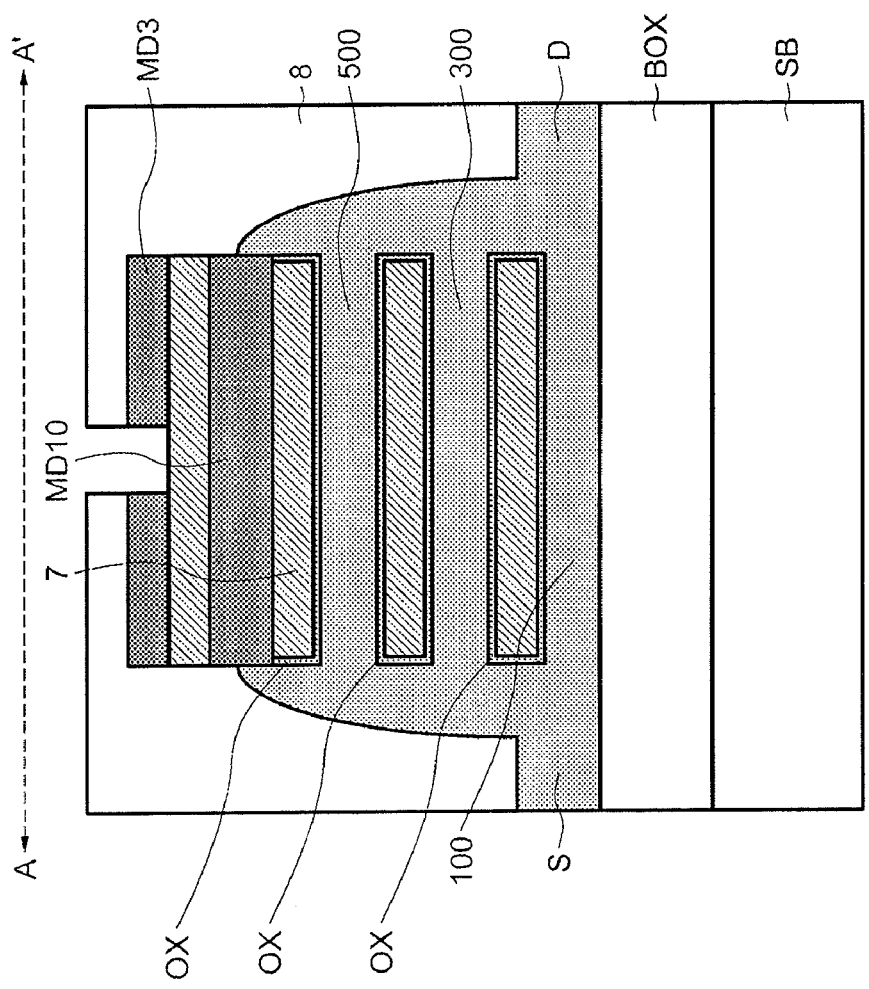

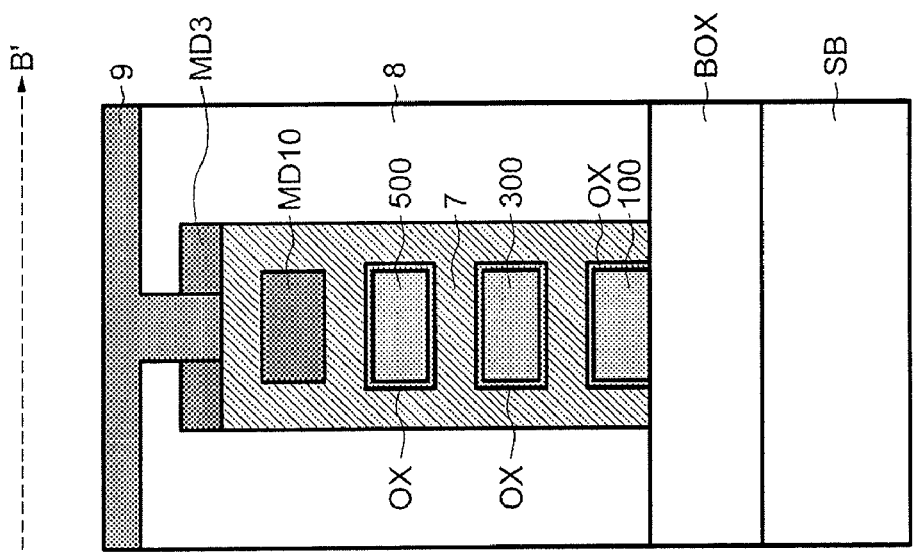
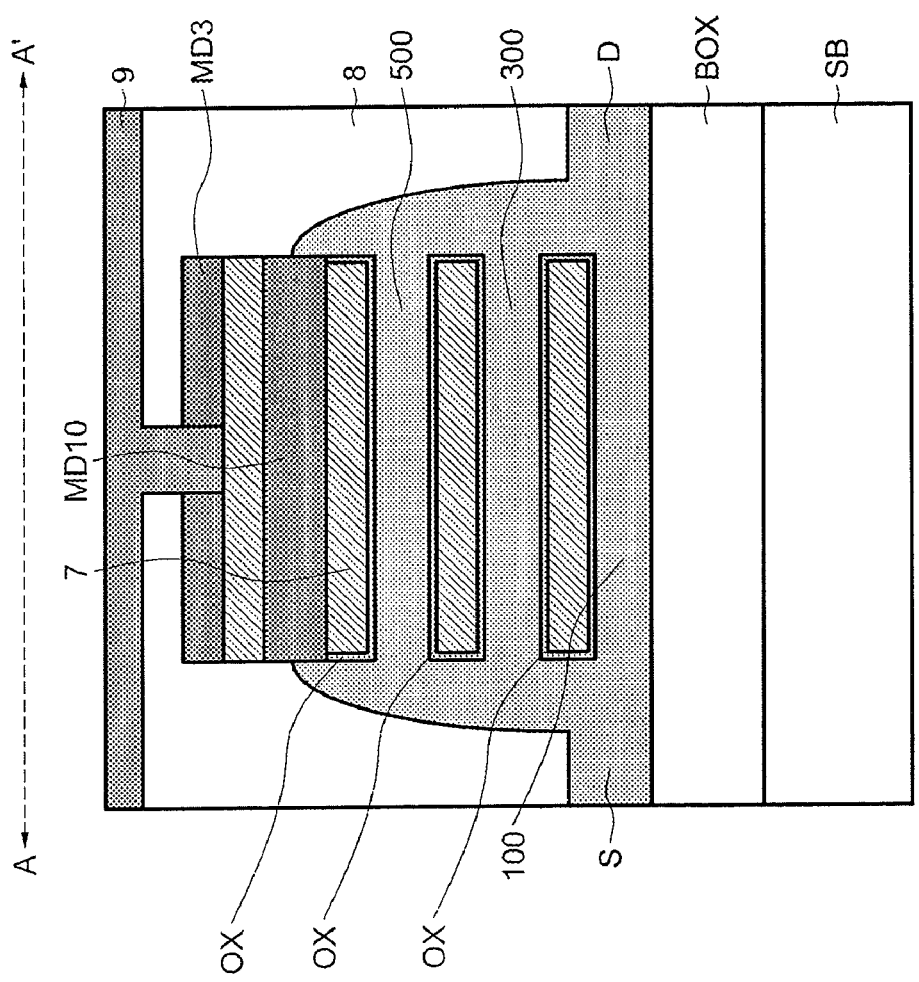

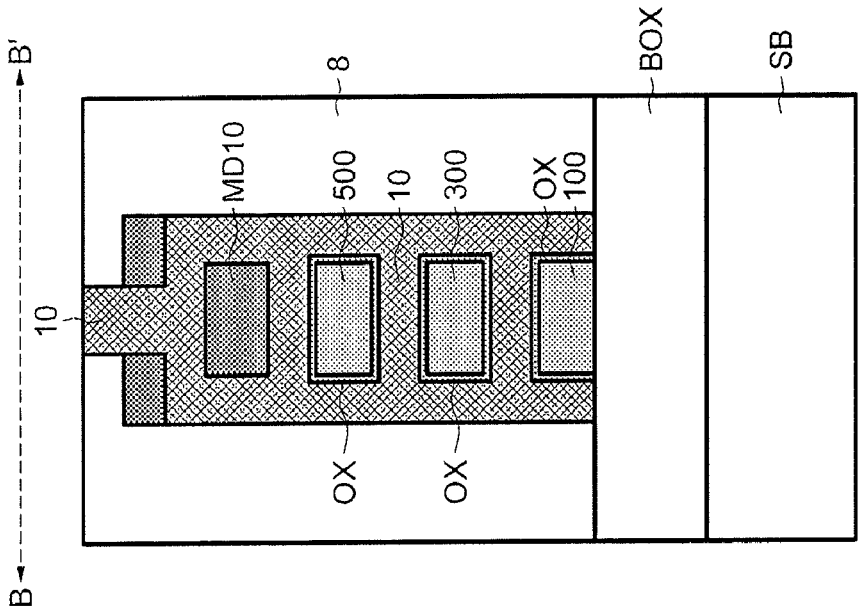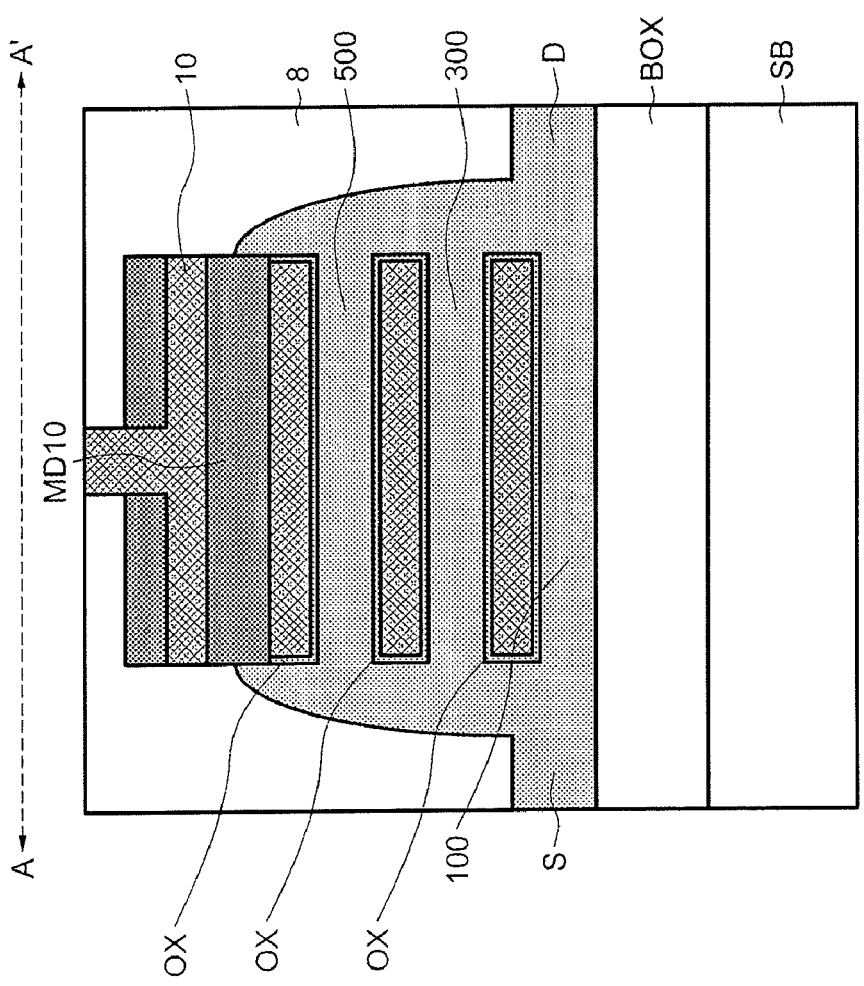

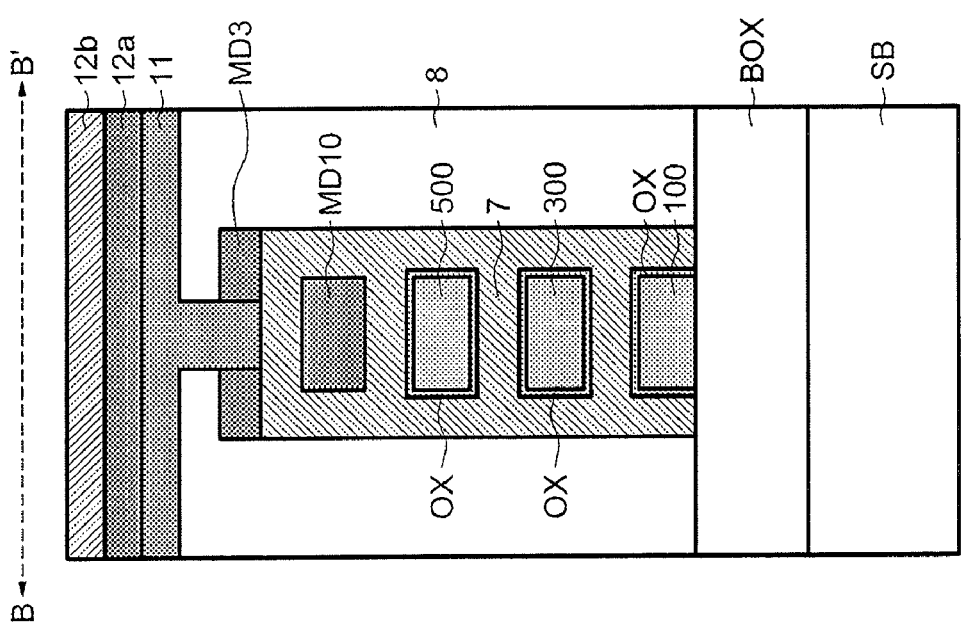
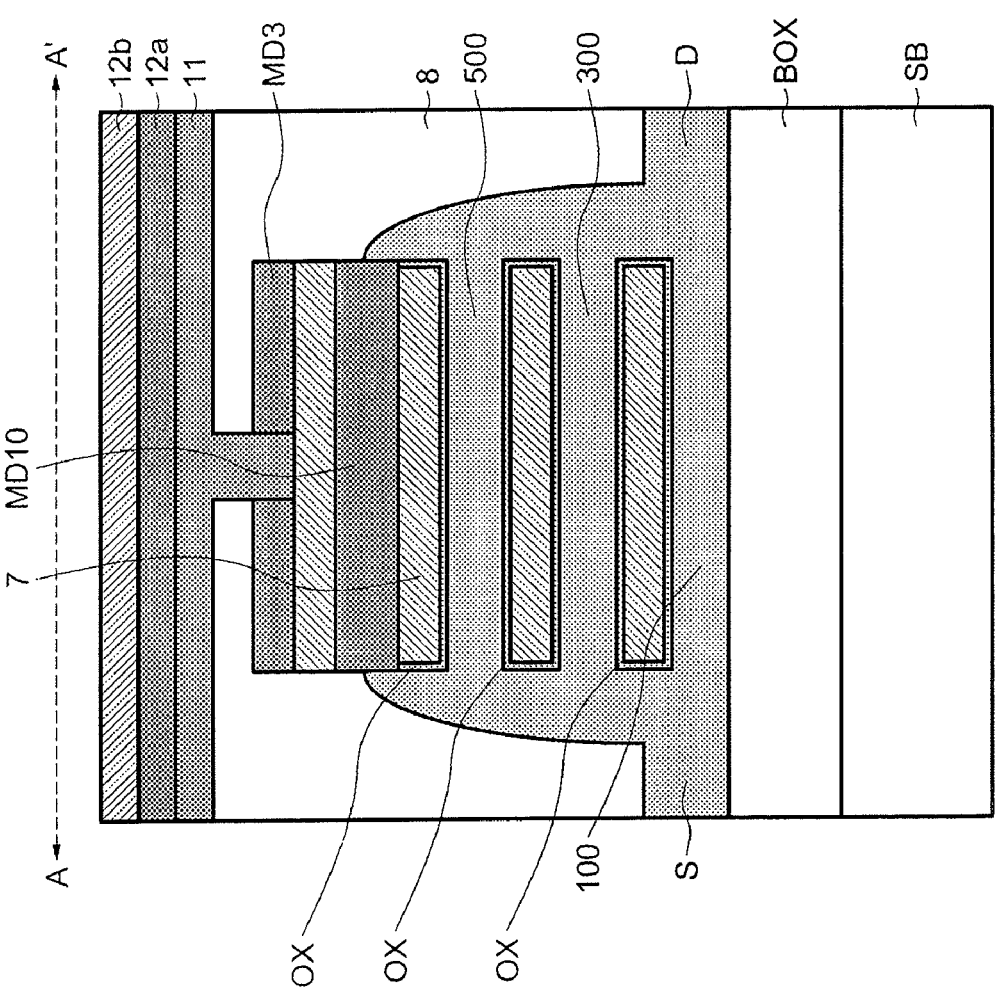

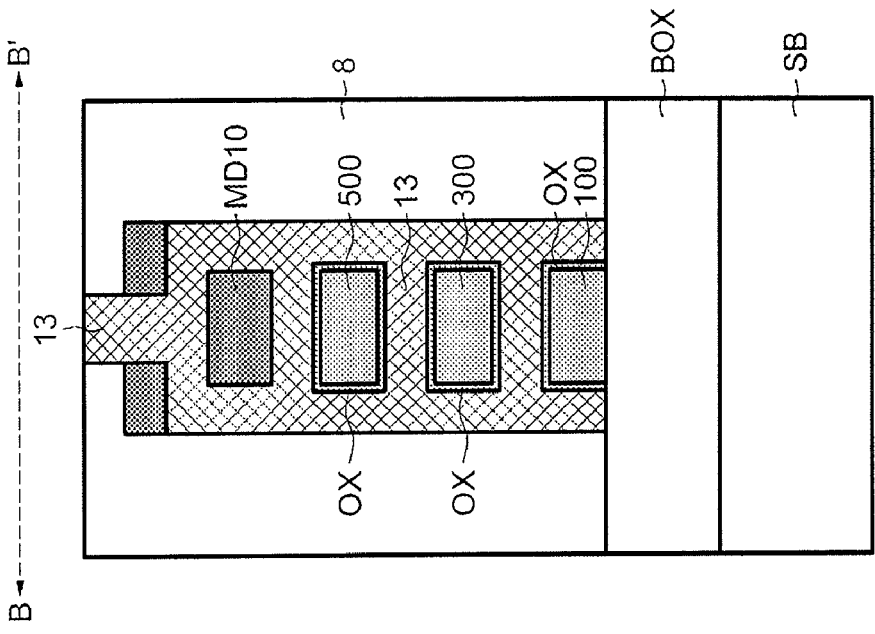
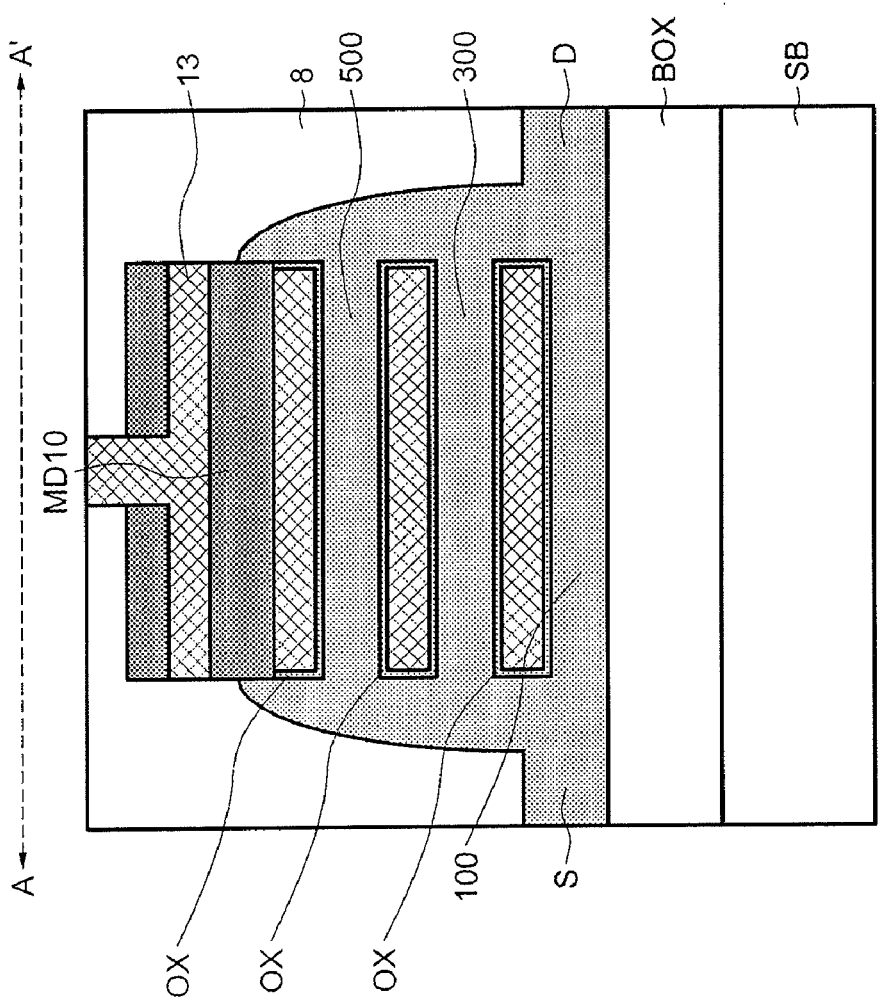

METHOD OF MANUFACTURING A BURIED-GATE SEMICONDUCTOR DEVICE AND CORRESPONDING INTEGRATED CIRCUIT

PRIORITY CLAIM

The present application is a translation of and claims priority from French Application for Patent No. 08 51265 of the same title filed Feb. 27, 2008, the disclosure of which is hereby incorporated by reference.

BACKGROUND OF THE INVENTION

1. Technical Field of the Invention

The present invention relates to integrated circuits, and more particularly to buried-gate semiconductor devices, that is to say those of which at least a portion of the gate region is placed below the channel region.

2. Description of Related Art

Among the semiconductor devices with so-called buried gates are distinguished devices with a double planar gate, that it so say in which the gate region comprises two gates, one of which is situated above the channel region and the other of which is situated below the channel region, and the so-called GAA (Gate All Around) devices in which the gate region is formed from a single part and surrounds the channel region.

Buried-gate devices, whether or not they are double-gate, are particularly advantageous for channel lengths less than 50 nanometers because they make it possible to eliminate the so-called short-channel effects while making it possible to obtain a current intensity that is doubled or tripled with respect to a conventional transistor. It is recalled here that a short channel has a very short distance (length) between the source and the drain and that the "short-channel" effect results in a reduction of the threshold voltage of the transistor, which can, at the extreme limit, result in obtaining a transistor that is very difficult to control and can finish up in the "piercing" mode.

The known buried-gate devices comprise a gate made from polysilicon. However, with the reduction of the dimensions for forthcoming semiconductor devices, a gate made of polysilicon causes the appearance of many limitations such as polydepletion, an incompatibility with dielectrics having a high dielectric constant and a gate resistivity that is too high.

One solution is notably the use of a metal gate, even if the adjustment of the threshold voltage of the device can necessitate a metal whose work function is variable. One example of metal gate devices are so called TOSI (Totally Silicided) devices which are made on the basis of a polysilicon gate above which is deposited, at the end of the manufacturing process, a metal which diffuses in the polysilicon during an annealing process. Another example of metal gate devices are devices whose polysilicon gate is etched at the end of the process, in order to deposit a metal gate in that place.

In the case of buried-gate devices, when the gate material is a metal silicide, the metal is deposited on the lateral walls of the polysilicon forming the gate region or regions. However, a poor formation of the metal silicide is obtained, notably because of the limited diffusion length of the metal in the polysilicon.

When the gate material is a metal, it is deposited under the channel regions, at the end of the transistor production process, and it must therefore be possible to deposit that material in cavities. The number of metals that can be considered is limited and the production of the device remains difficult.

SUMMARY OF THE INVENTION

According to one aspect, a method is proposed for manufacturing a semiconductor device comprising a semiconductor channel region and a gate region, the gate region comprising at least one buried part extending under the channel region. The formation of the buried part of the gate region comprises: a formation of a cavity under the channel region, the filling of the cavity with a first material, the putting into contact with the first material of aluminum or a second semiconductor material different from the first material, and a substitution of the first material by aluminum, or the formation of a third material by diffusion of the second semiconductor material into the first material.

The cavity can, for example, be a hollowed volume, having upper and lower walls, and able to be open and accessible from the outside through a lateral wall.

The cavity can thus have a high shape factor, that is to say it can for example have one dimension very much greater than the other two. In this case it will be possible to access the cavity through a lateral surface whose sides are the two small dimensions, while the upper wall and the lower wall comprise the very high dimension.

The cavity is thus filled by the first material, and the gate metal is formed during a following stage. In particular, it is possible to form the metal in the cavity even if the latter cannot be deposited by a standard depositing method. In the present case, the metal gate is formed in the cavity by substitution of a metal for the first material which itself can be deposited in the cavity, or by diffusion of the second semiconductor material in the first material. There is therefore only a single material, the first one, which is deposited in the cavity, the other materials (aluminum or the second semiconductor material) being deposited by conventional depositing methods and in less constraining conditions.

It is thus notably possible to produce buried-gate semiconductor devices of different types, for example NMOS and PMOS, by using, for one type, a step of substitution by aluminum and, for the other type, a step of diffusion in order to form the third material. The method has the advantage of differentiating the two types of buried-gate semiconductor devices during the last stages of the method, the first steps being common to the production of both types of buried-gate semiconductor devices.

According to one implementation, the formation of the buried part of the gate region can also comprise the putting of aluminum into contact with the third material, and a substitution of the third material by aluminum.

This implementation is particularly advantageous when it is desired to produce two buried-gate semiconductor devices of different type, for example NMOS and PMOS, with few different steps of the method. Initially, only semiconductor devices of a given type are produced, for example PMOS, by formation of the third material. Then, an additional step of substitution of the third material by aluminum specifically at the position of the semiconductor devices which must be of a different type, NMOS for example.

The filling of the cavity can advantageously comprise a standard deposit of the first material in the cavity, and the substitution or diffusion step can include an annealing.

The first material is for example polysilicon or polysilicongermanium. In particular, the filling of the cavity with polysilicon or with polysilicon-germanium can be carried out by a method known to those skilled in the art, for example by ALD (Atomic Layer Deposition) or by CVD (Chemical Vapor Deposition). It is preferably deposited at the moment of formation of the gate region and is not already present before the steps of formation of the gate material.

The step of substitution of aluminum for the polysilicon or the polysilicon-germanium can therefore notably be carried out according to the method described in the article "Characteristics of Aluminum Substitution Technology for Self-Aligned Full Metal Gate nMOSFETs" in the publication IEEE Transactions on Electron Devices, vol. 52, No. 5, May 2005, the disclosure of which is hereby incorporated by reference.

The standard deposition of the first material notably makes it possible to deposit the material along the different walls of a cavity having a high shape factor, and the substitution step makes it possible to then obtain a region of homogeneous aluminum in the cavity previously filled with the first material.

Advantageously, it is possible to choose the relative quantity of the first material and of the second semiconductor material in the buried part of the gate, in order to adjust the threshold voltage of the semiconductor device. In particular, the relative quantity of the first material and of the second semiconductor material in the buried part of the gate can be adjusted by the duration of the annealing.

The threshold voltage of the semiconductor device notably depends on the work function of the gate material. Now, the work function of the alloy of the gate material depends on the relative quantity of the two materials in the third material. It is therefore possible to adjust the threshold voltage by adapting the duration of diffusion of the second semiconductor material in the first material.

Advantageously, the formation of the gate can comprise: the formation on the upper surface of the substrate of a stack formed by at least one layer of silicon placed above a sacrificial layer formed of a material that can be eliminated selectively with respect to the silicon, an epitaxial growth of silicon on the lateral walls of the stack, an anisotropic etching of the stack in such a way as to etch a part of the epitaxied silicon and to access at least one of the ends of the sacrificial layer, a selective isotropic etching of the sacrificial layer, the formation, on the walls of the cavity resulting from the isotropic etching, of a layer comprising a dielectric material, the standard deposit in the cavity, of the first material, the deposit of aluminum or of the second semiconductor material in contact with the first material, and an annealing for the formation of the gate material.

As a variant, and notably in order to obtain a surrounding gate device, the formation of the gate region can comprise the standard deposit of the first material around the part of the semiconductor channel region in such a way that the gate region surrounds the semiconductor channel region.

According to another aspect, there is proposed a semiconductor device comprising a semiconductor channel region and a gate region, in which the gate region comprises at least one buried part extending under the channel region, and in which the buried part of the gate region comprises aluminum or an alloy of a first material and second semiconductor material.

Advantageously, the alloy of the first material and of the second semiconductor material comprises a relative proportion of first material and second material making it possible to obtain a desired threshold voltage for the semiconductor device.

The gate region can surround the channel region.

According to another aspect, there is proposed an integrated circuit comprising a device such as described above.

BRIEF DESCRIPTION OF THE DRAWINGS

The present invention will now be illustrated, by way of non-limiting examples, through a description of embodiments of electrical bonding pads with reference to the drawings in which:

FIGS. 1 to 13b are diagrammatic illustrations of the principal steps of a first implementation of the method;

FIGS. 14a to 15b are diagrammatic partial illustrations of a second implementation;

DETAILED DESCRIPTION OF THE DRAWINGS

There is described here, by way of example, a method for manufacturing a transistor with a surrounding gate comprising for example three semiconductor channel regions, two of which are surrounded by the gate region.

Figure 1:
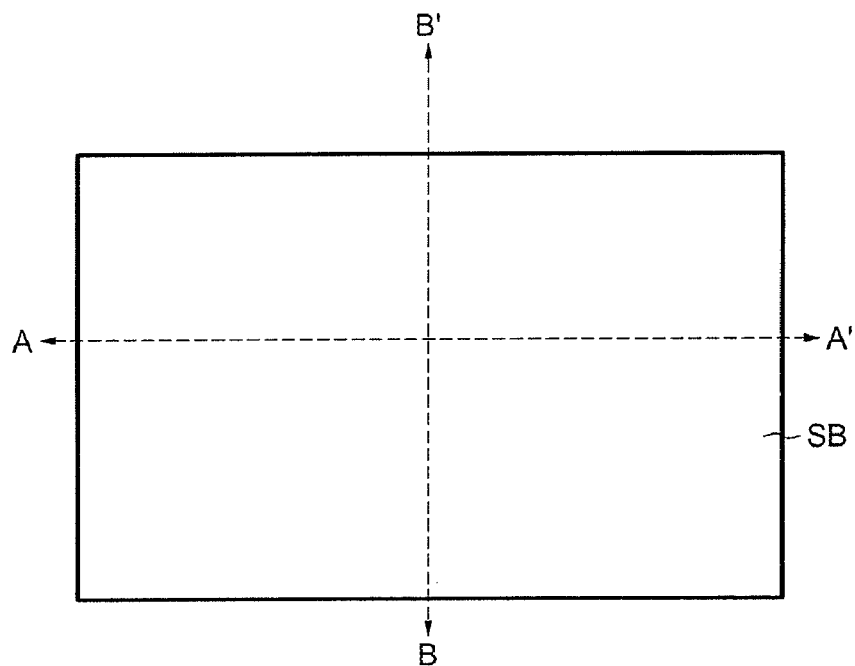

In FIG. 1, the reference SB indicates a semiconductor wafer or semiconductor substrate that has been shown here in plan view in a rectangular shape for purposes of simplification.

In the rest of the FIGURES, those which are numbered with the letter "a" correspond to a cross-sectional view in the direction AA' of FIG. 1, while those which are numbered with the letter "b" correspond to a cross-sectional view in the general direction BB'.

Figure 2:
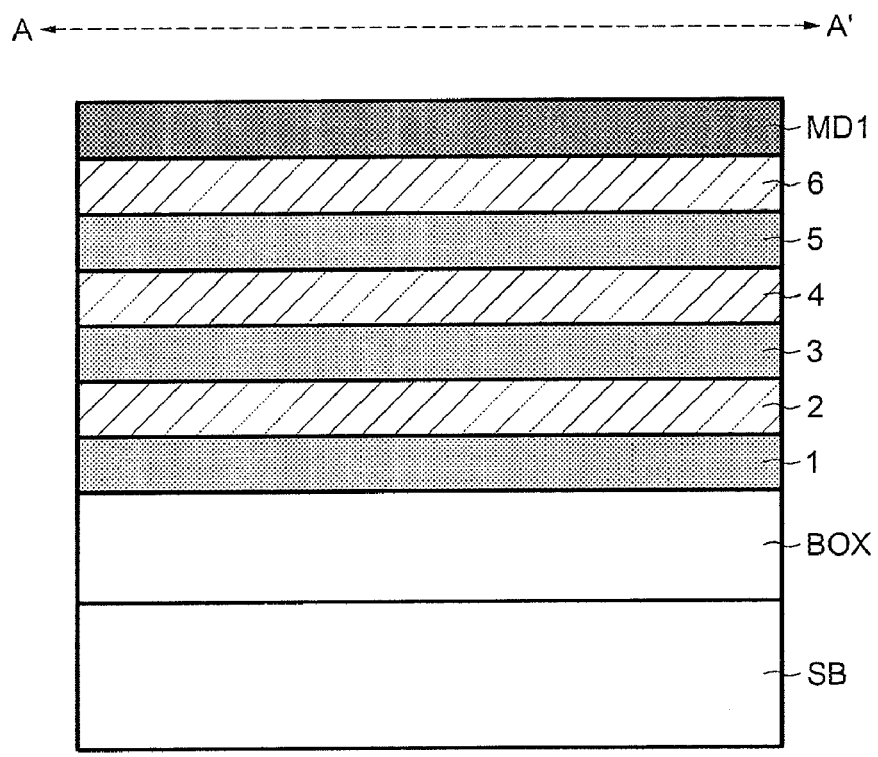

The first phase of the method comprises, as shown in FIG. 2, in forming on the substrate SB an insulating base layer (buried oxide) BOX surmounted by a stack formed from a first layer of silicon 1, a second layer of silicon 3 encapsulated between two sacrificial layers 2 and 4, and a third layer of silicon 5 encapsulated between the sacrificial layer 4 and a sacrificial layer 6. The sacrificial layers 2, 4 and 6 are, for example, formed from a silicon-germanium alloy.

The stack is itself surmounted by a hard mask layer MD1, for example a layer of silicon nitride, produced conventionally by deposition.

The formation of these superimposed layers can be carried out for example by a molecular bonding technique well known to those skilled in the art. More precisely, the BOX layer is formed by thermal oxidation on the substrate SB while the stack of layers 6, 5, 4, 3, 2 and 1 is formed on a second substrate, for example by non-selective epitaxy. The upper surface of the layer 1 is then bonded, by molecular bonding, onto the upper surface of the insulating layer BOX. After removing the second substrate, the substrate SB is obtained, surmounted successively by the layers BOX, 1, 2, 3, 4, 5 and 6. The formation of the hard mask MD1 is carried out conventionally by deposition on the layer 6 in such a way as to form the structure shown in FIG. 2.

By way of indication, the thickness of the BOX layer can be between 100 and 400 nanometers for example, while the thickness of the layers 1, 3, 5 can be between 10 and 30 nanometers for example, and the thickness of the sacrificial layers 2, 4, 6, instead and in place of which, as will be seen in more detail hereafter, the gate regions will be produced, can for example be between 10 and 70 nanometers depending on the type of semiconductor device formed.

Then, as shown in FIGS. 3a and 3b, there is formed, by a conventional photolithography step, a block of resin MD10 in the silicon nitride layer MD1, and a vertical etching GRV1 is carried out stopping on the first layer of silicon 1 (FIGS. 4a and 4b). This etching can be plasma etching for example. The geometry of the block MD10 corresponds to the geometry of the future gate of the semiconductor device, that is to say the block MD10 will make it possible to define what will be the length L of the channels of the semiconductor device.

In particular, the length L of the channels will preferably be between 20 nanometers and 60 nanometers, while the width W will be between 50 nanometers and 500 nanometers.

Then there is made to grow, by epitaxy starting from the lateral walls of layers of silicon 30 and 50, and starting from the upper surface of the silicon layer 1, source S and drain D regions. The source S and drain D regions are connected by the different layers of silicon which thus form the channels 100, 300, 500 of the semiconductor device (FIG. 5a).

During the formation of the source S and drain D regions, the epitaxial growth of the silicon also results in the formation of two other silicon regions RS1 and RS2 (FIG. 5b).

Figure 6A:
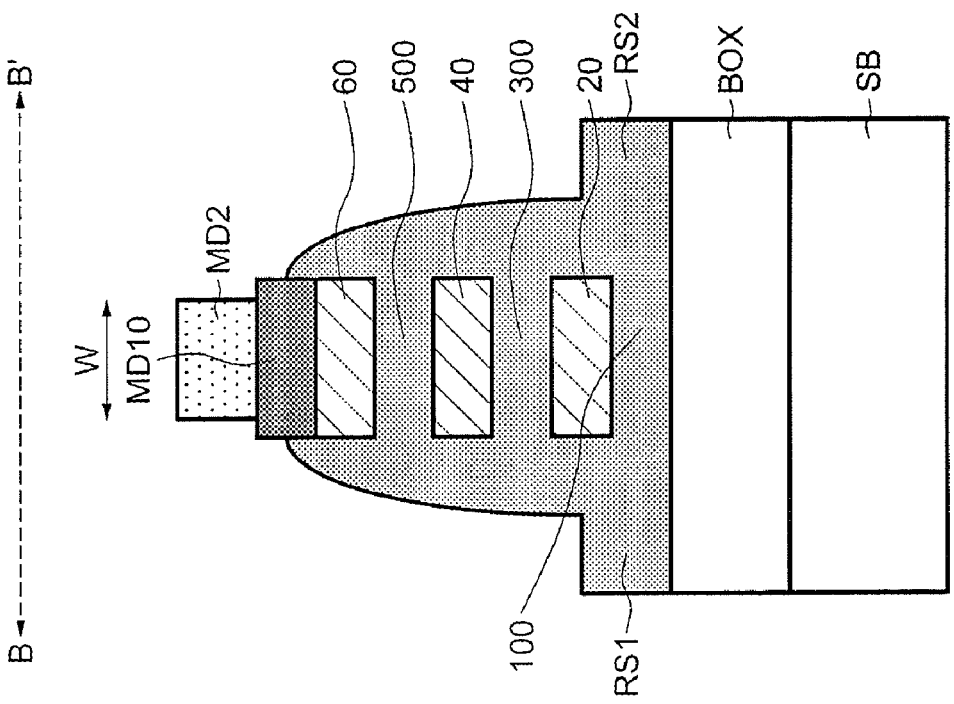
Figure 6B:
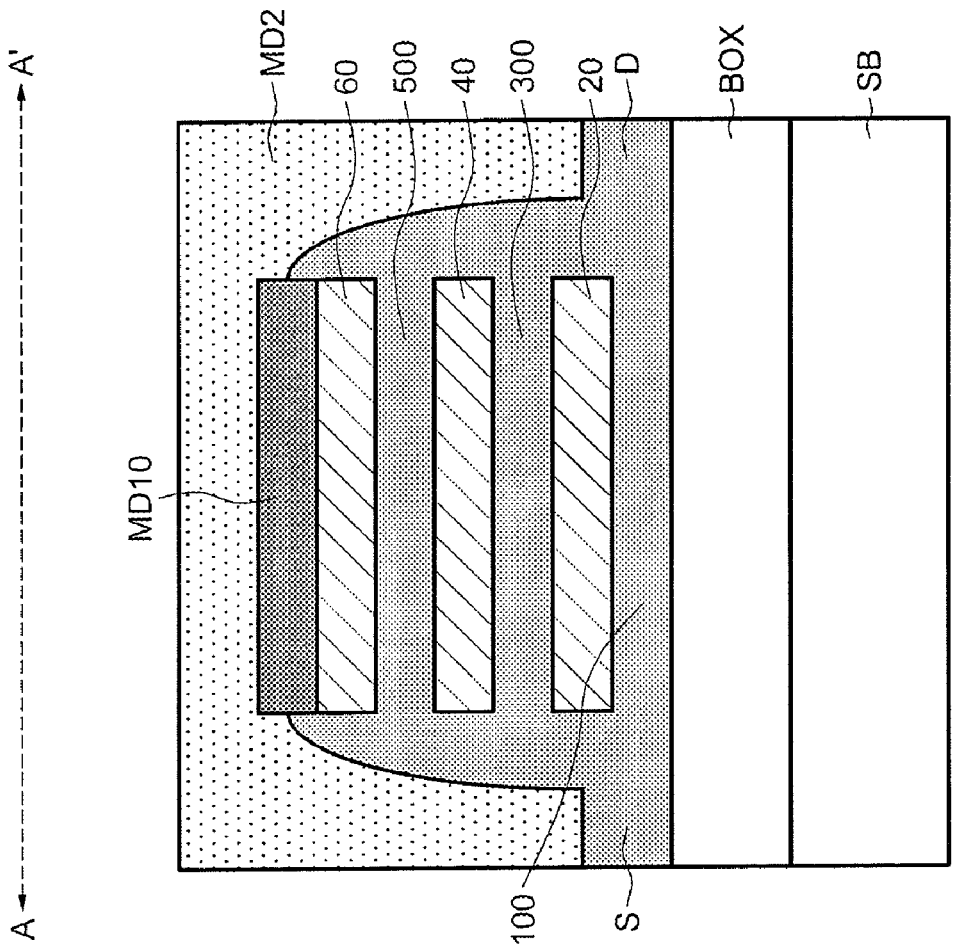

After having deposited a dielectric film, for example made of $SiO_2$, on the block of resin MD10, a second block of resin MD2 is then formed, using a conventional photolithographic stage, in such a way as to allow at least the silicon regions RS1 and RS2 to appear (FIGS. 6a and 6b). The second block of resin MD2 will make it possible to define what will be the width W of the channels of the semiconductor device.

Figure 7B:
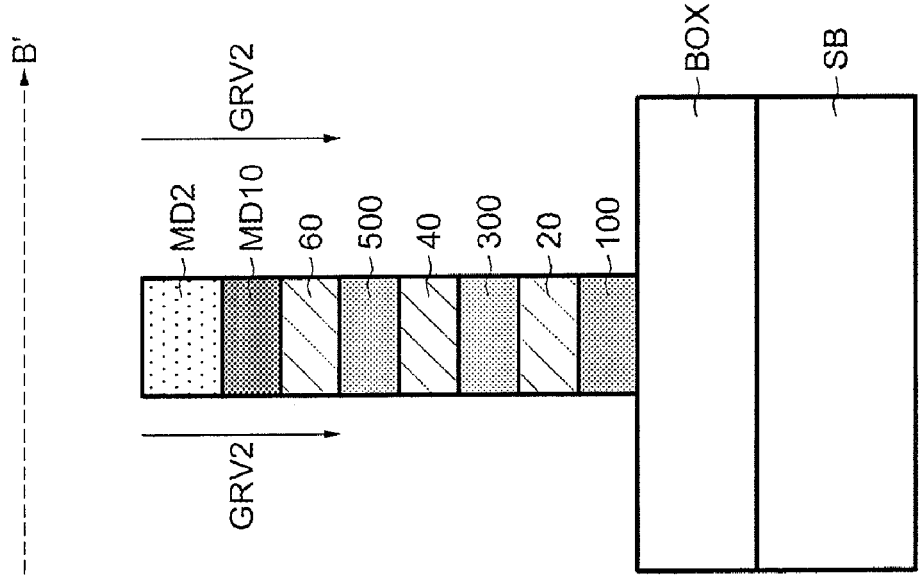
Figure 7A:
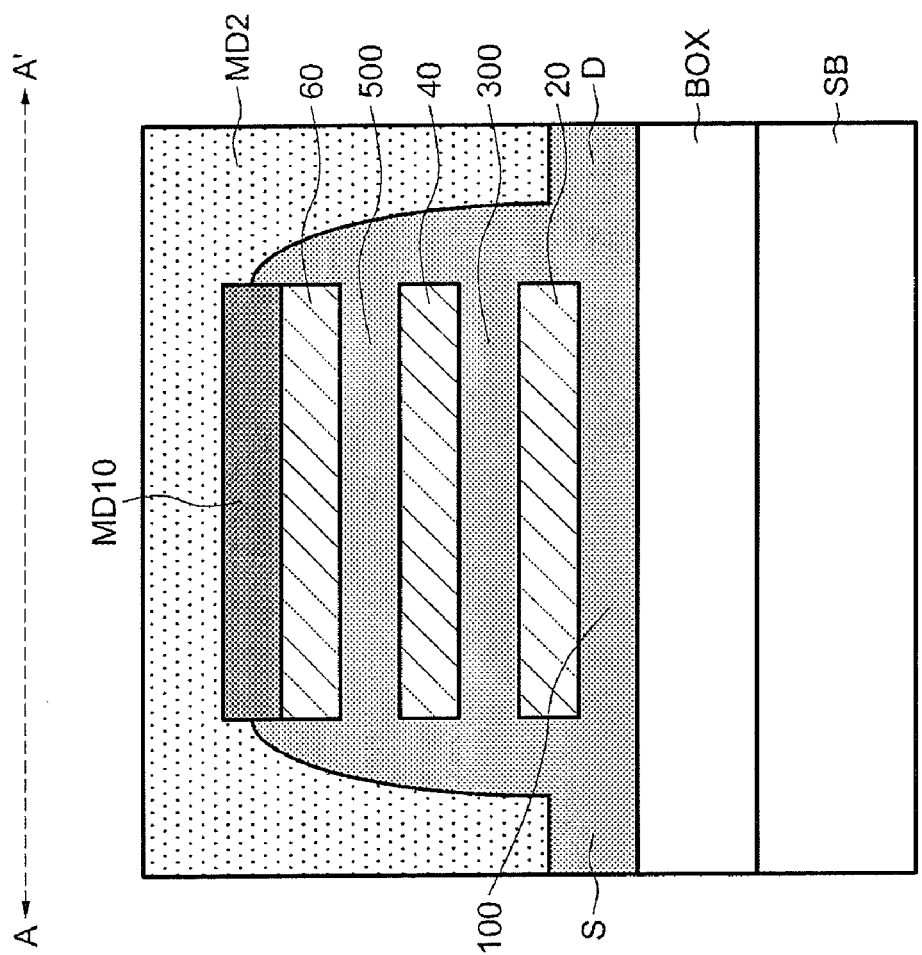

A second etching GRV2 is then carried out, stopping on the insulating base layer BOX. This etching can be plasma etching for example (FIGS. 7a and 7b).

The etching GRV2 makes it possible to etch the silicon regions RS1, RS2 and to access certain lateral walls of the sacrificial layers 20, 40 and 60, previously covered by the epitaxed silicon layer. It is then possible, after the etching of the hard mask layer MD2 and by means of selective lateral isotropic etching GRL, to etch the three sacrificial layers 20, 40 and 60.

The features of such an etching are well known to those skilled in the art and have been the subject of many publications, notably the French patent application No. 2,791,178, the disclosure of which is hereby incorporated by reference.

More precisely, it will for example be possible to use well-known oxidizing chemical means such as a solution of 40 ml $HNO_3$ at 70%+20 ml $H_2O_2$+5 ml HF 0.5%, or an isotropic plasma attack.

It is appropriate to note here that even though any material that can be eliminated selectively with respect to the silicon can be suitable, the $Si_{1-x}Ge_x$ alloys are recommended because they are easy to eliminate selectively by such oxidizing chemical means or by an isotropic plasma attack. These alloys also facilitate the epitaxial production of the initial fine layers of silicon 1, 3 and 5.

As shown in FIGS. 8a and 8b, empty spaces ESV1 are therefore created around the channels 100, 300 and 500 which form a bridge between the source S and drain D regions. The empty spaces ESV1 are cavities which are accessible via the accesses used for the lateral etching GRL, but which are also covered by other layers, in the present case either a channel layer or a hard mask layer.

The three sacrificial layers are etched in such a way as to form the gates of the final device in their position.

Figure 9B:
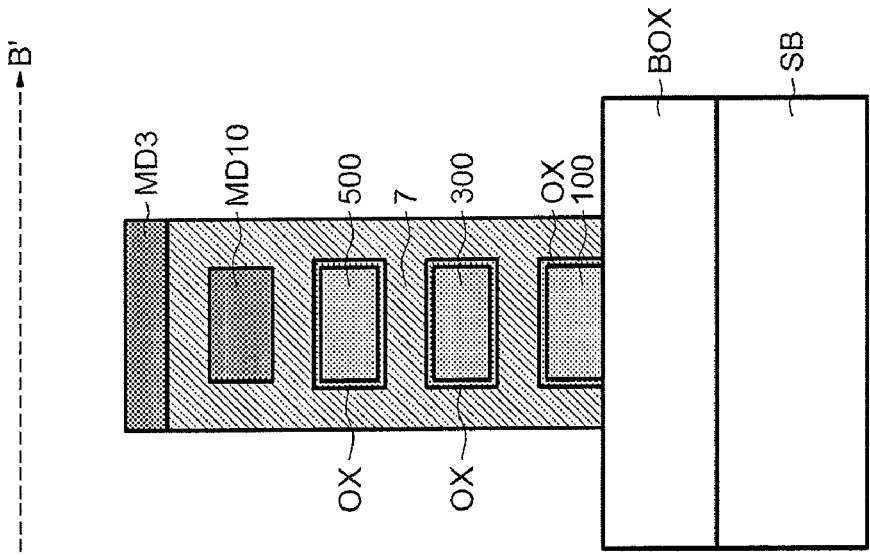
Figure 9A:
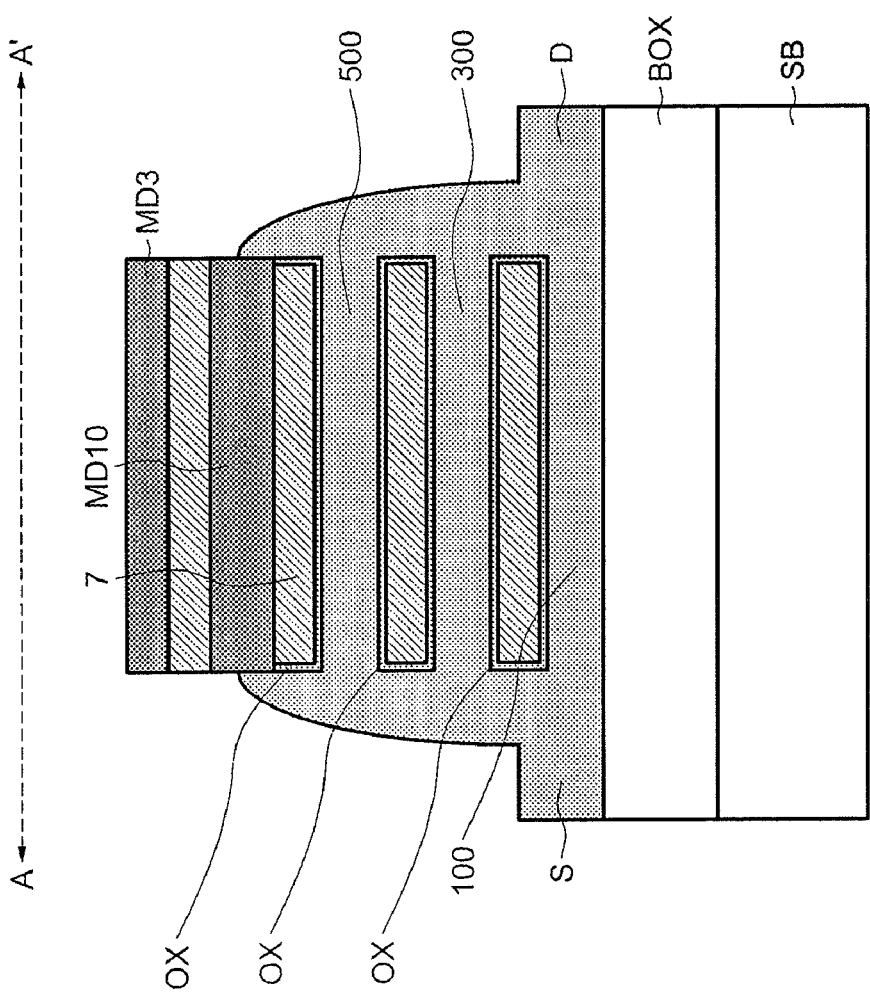

The next step, shown in FIGS. 9a and 9b, comprises filling the cavities or tunnels resulting from the selective isotropic etching of the sacrificial layers. Initially, there is therefore formed on the walls of the empty spaces ESV1 or cavities, a layer of dielectric material OX in order to ensure a total insulation of the flanks. In particular, the layer of dielectric material OX constitutes the gate insulator of the final semiconductor device.

This layer of insulating dielectric material OX can be obtained for example by a high temperature deposit of a TEOS oxide film. As a variant, it is possible to use an insulating material known to those skilled in the art as BSG (Borosilicate Glass) which has better etching selectivity in comparison with the BOX layer than that of a TEOS oxide.

It is also possible to carry out a thermal oxidation in order to form a fine layer of silicon oxide OX on the surface of the silicon flanks of the empty spaces ESV1.

The empty spaces ESV1 are then filled with a layer of first material which surrounds the channels 300 and 500 in such a way as to form only one single region of first material 7.

The first material 7 can, for example, be polysilicon formed by a CVD or ALD deposit, or it can be polysilicon-germanium. The CVD or ALD deposits are standard deposits which make it possible to form a layer even on the inside walls of the cavities. In both cases, the first material 7 is preferably doped with boron, for example strongly doped with boron, in order to favor the diffusion of the second semiconductor material or the substitution with aluminum. This also makes it possible to obtain, as the work function, a value adapted to PMOS transistors, that is to say a value between the upper energy of the valence band of silicon (5.12 eV and the central value of the silicon gap.

A third block of resin MD3 is deposited on the upper part of the region of first material 7 in order to prevent the siliciding of the first material during the siliciding of the source S and drain D regions.

Figure 10B:
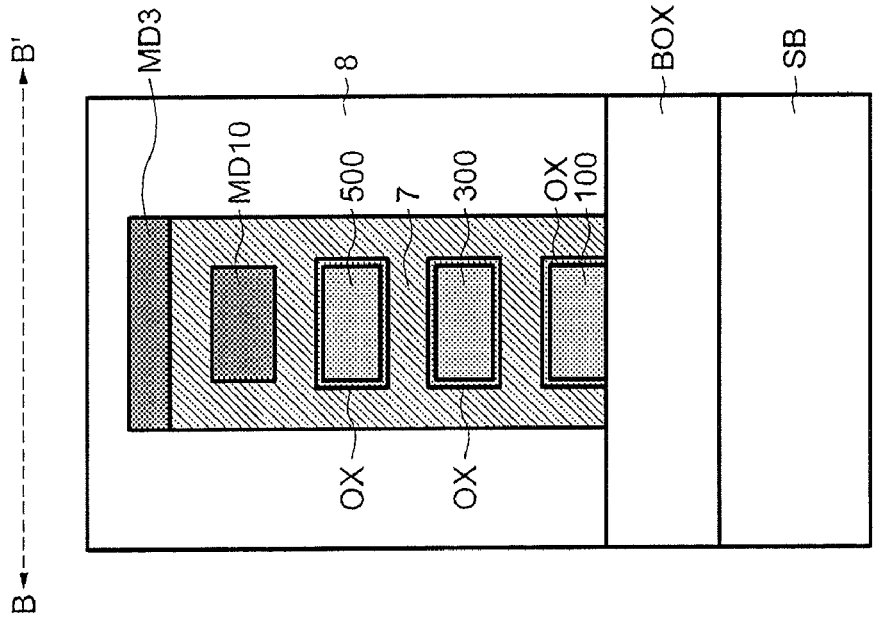
Figure 10A:
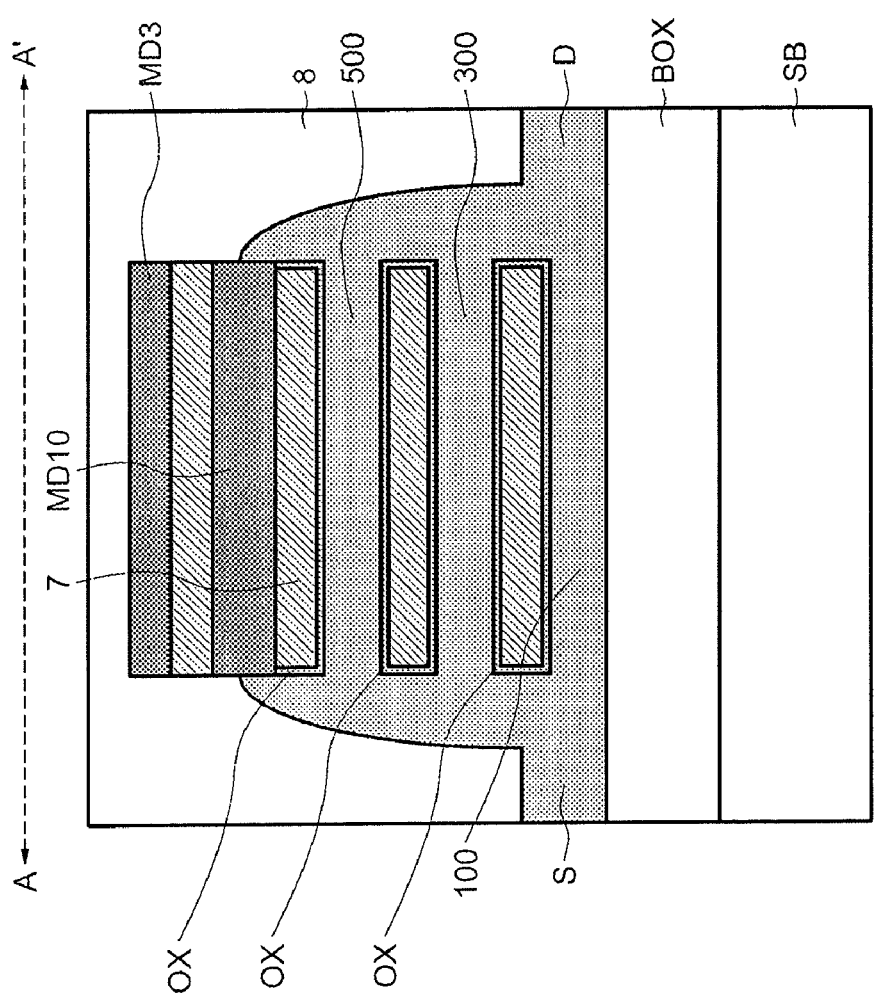

The source S and drain D regions are silicided (not shown) and then the semiconductor device is covered with a dielectric layer (PMD) 8 and a mechanical-chemical polishing step is carried out (FIGS. 10a and 10b).

An opening is then formed in the dielectric layer 8 and the third block of resin MD3 in order to reach the upper surface of the region of first material 7 (FIGS. 11a and 11b).

According to a first implementation (FIGS. 12a and 12b), a layer of a second material 9, different from the first material, for example germanium) is deposited conventionally on the dielectric layer 8 and in the openings formed in the latter. In particular, it is not necessary to use a standard deposition method in order to produce the layer of second material 9 and it is sufficient for the second semiconductor material to be in contact with at least a part of the region of first material 7.

It is then possible to carry out an annealing step during which the region of first material 7 and the layer of second material 9 will form a region of metal alloy which is the gate region 10 of the semiconductor device (FIGS. 13a and 13b). For example, when the first material is polysilicon and the second material is germanium, it is possible to form, during the annealing step, a silicon-germanium alloy, in particular an amorphous or polycrystalline alloy. The annealing temperature can be between 700° C. and 900° C., for example of the order of 800° C. The alloy thus formed has metallic behavior of the P+ type, and therefore makes it possible to obtain a PMOS semiconductor device. Moreover, the relative proportion of germanium with respect to silicon in the gate region 10 makes it possible to adjust the work function of the alloy, and therefore the threshold voltage of the PMOS device. Notably, the duration of the annealing makes it possible to adjust the relative proportion of germanium in the gate alloy 13 and therefore the threshold voltage of the semiconductor device.

According to a second implementation (FIGS. 14a and 14b) a layer of aluminum 11 is deposited on the dielectric layer 8 and in the opening of the latter. Moreover, in order to favor the step of substitution of the first material by the aluminum, there is deposited, on the aluminum layer 11, a layer 12 formed of a trapping layer 12a, and eventually a stopping layer 12b, deposited on said trapping layer 12a.

The thickness and the area of the aluminum layer 11 are determined so that the volume of this layer, available at the contact surface between layer 11 and region 7, is in excess compared to the volume of region 7.

The trapping layer 12a includes a material able to fix the first material diffusing in to the trapping layer. The material is also chosen so that it is not too reactive to the cavity walls materials and to gate dielectric. It is therefore possible to use a layer 12a comprising titanium, for example a layer of titanium and of titanium nitride. The dimensions of layer 12a are chosen so that the entire volume of the first material of region 7 can be trapped, eventually taking into account the alloy resulting from the trapping of the first material by the material of layer 12a.

The first material present in the aluminum can thus be trapped, during the substitution, by the trapping layer 12a, therefore reducing the concentration of the first material in the aluminum of layer 11. A metallic gate can thus be obtained, the characteristics in terms of resistivity and work function of said metallic gate are weakly dependent on the residual concentration of the first material in the aluminum.

The stopping layer 12b includes an inert material, as for example titanium nitride, acting as a barrier as regards impurities and external gas (for example residual atmosphere during annealing treatment) which could react with the trapping layer 12a and therefore consume a part of it.

The annealing step makes it possible to carry out a substitution of the first material (notably deposited in the cavities ESV1) by aluminum. The annealing stage is for example carried out at a temperature of between 350° C. and 425° C. At the end of the substitution step a gate region 13 made of aluminum, and therefore metallic, is thus obtained. As for the first material previously contained in the region of first material 7, it then appears above the gate region 13 and can be removed by etching with the titanium and the titanium nitride, and possibly the residual aluminum (FIGS. 15a and 15b).

In particular, the temperature of the substitution step is chosen in order to be compatible with the steps previously realized, particularly when it is realized at the end of the process. Thus, when the substitution step is performed after having silicided nickel-based junctions, it is possible to use a temperature of about 350° C. for the substitution. In this case, the substitution step is realized in a few tens of minutes for substitution lengths of several micrometers, and is compatible with the nickel silicide of the junctions.

As aluminum has N+ type behavior, an NMOS type semiconductor device is obtained with the second implementation.

The final step in producing the component consists in conventional putting onto contact operations at the level of the gate zones (made of aluminum or of polysilicon-germanium alloy). It is appropriate to note here that such a component can easily be incorporated in an integrated circuit placed on another wafer for example (the COC (Cell On Chip) concept).

The device thus obtained comprises, in the embodiment shown in FIGS. 13a and 13b or 15a and 15b, a source region S, a channel region (100, 300, 500), a drain region D and a metal gate region 10 or 13 respectively. Moreover, the source, channel and drain regions are totally isolated from the substrate SB on the one hand and from the gate region on the other hand, by an insulting cladding OX and by the BOX layer. More particularly, in the previously described cases, the semiconductor devices comprise three channels 100, 300, 500, two of which (300, 500) are surrounded by the gate.

According to a third implementation, it is possible to integrate different types of semiconductor devices (NMOS and PMOS) by simultaneously carrying out the principal steps described above. In this third implementation, the types of semiconductor devices produced can be determined during the putting into contact of the first material with the second semiconductor material or with the aluminum, that is to say that the semiconductor devices of different type will be produced in a similar way but with different gate materials.

Therefore, the first steps of the method are carried out in common for both types of semiconductor devices, with the exception of the step of producing the layer of second material or of aluminum. In fact, depending on whether the material of the second material is aluminum or germanium, an NMOS or a PMOS semiconductor device respectively will be produced.

Figure 16:
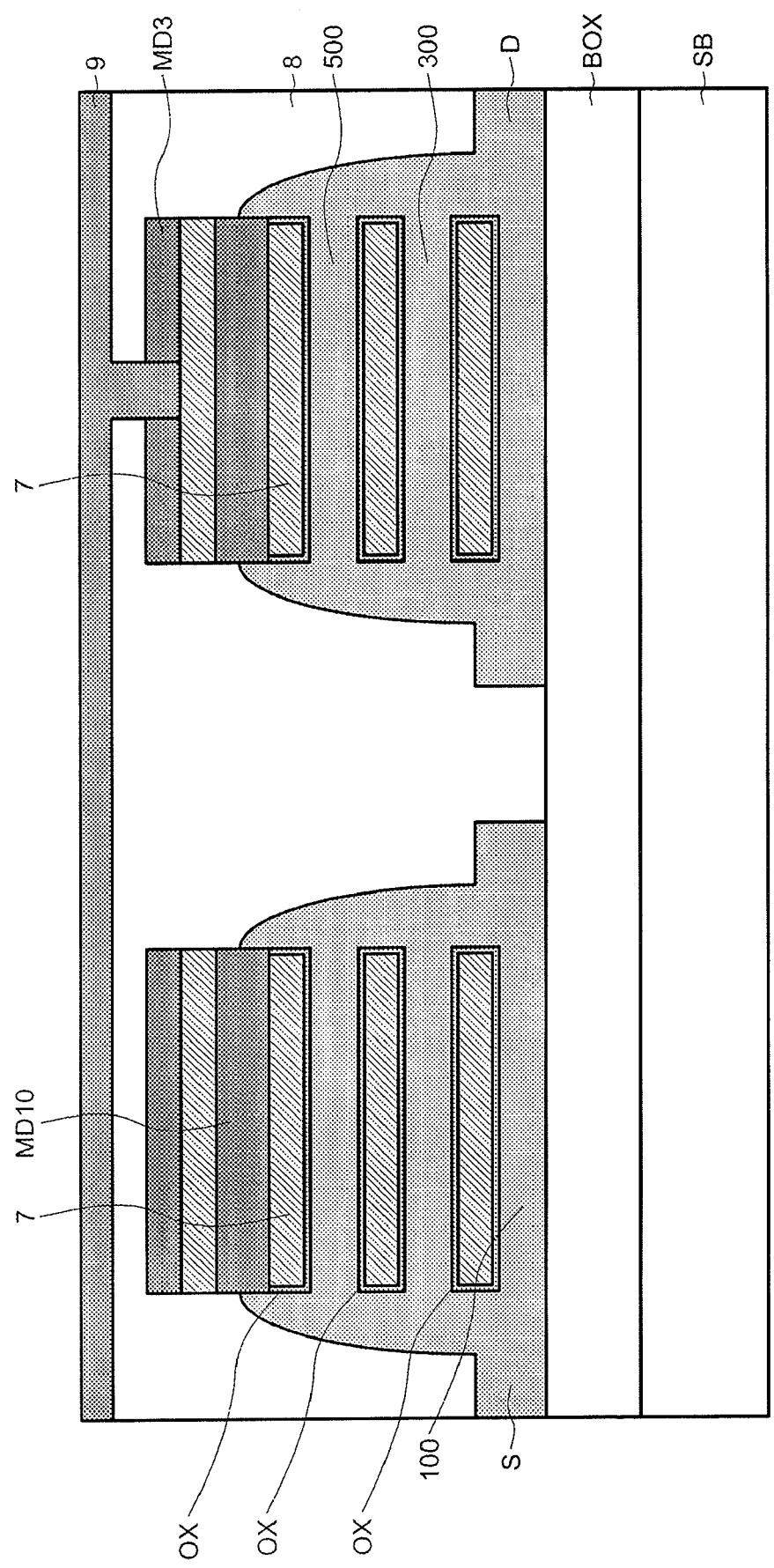
FIGS. 16 to 19 are diagrammatic partial illustrations of a third implementation.

Thus, when the dielectric layer 8 is formed, the production methods differ between the two types of semiconductor devices: the process therefore starts, for example, by forming openings to reach the region of first material 7 of the PMOS semiconductor devices. The layer of second material 9, made of germanium, which comes into contact with the region of first material 7 is then formed only at the positions of the various PMOS semiconductor devices (FIG. 16).

A first annealing, at a temperature of about 900° C., makes it possible to form the polysilicon-germanium and to thus obtain PMOS semiconductor devices with a gate region 10, whilst the other semiconductor devices remain covered by the dielectric layer 8.

Figure 17:
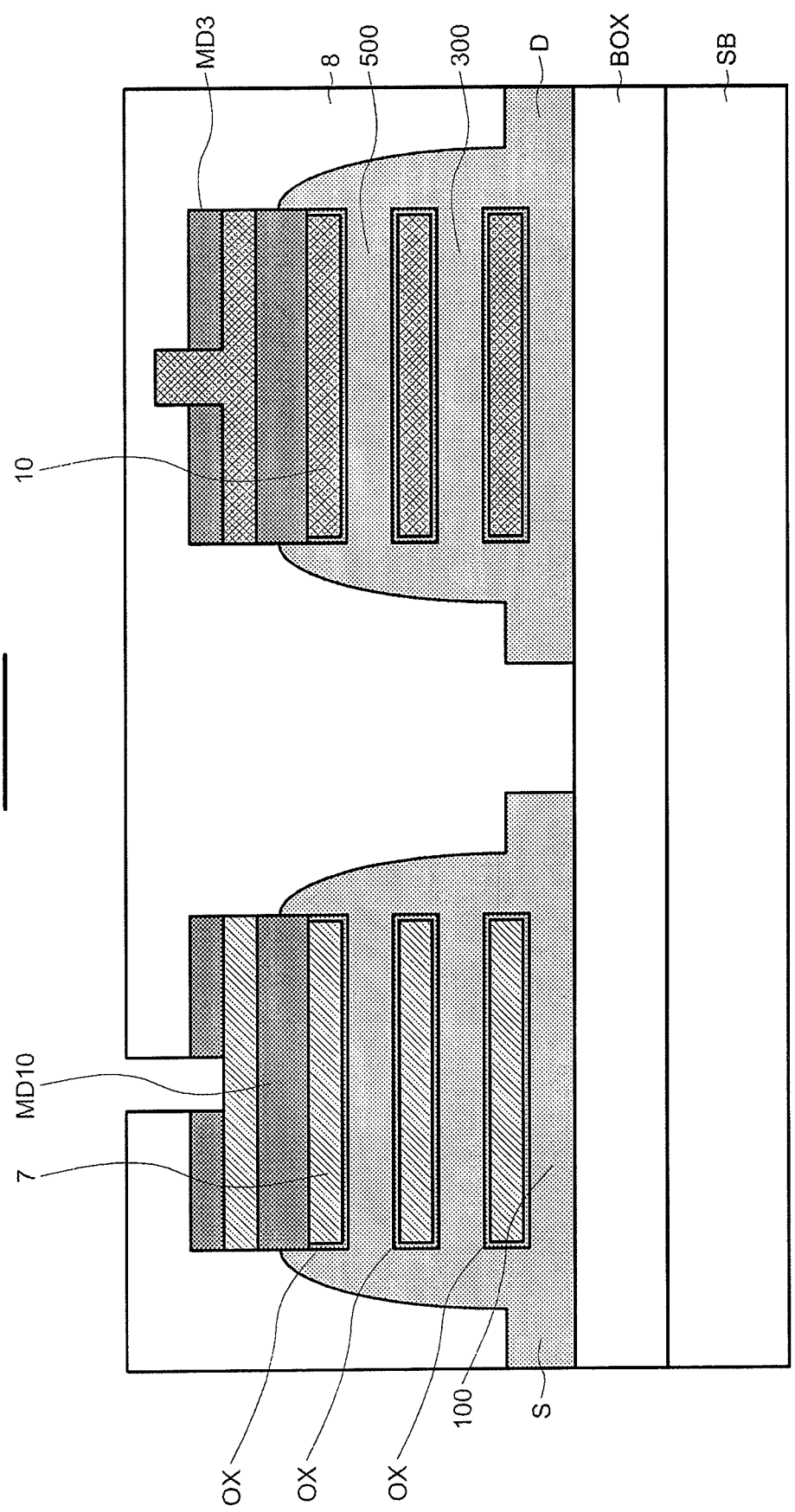
Figure 18:
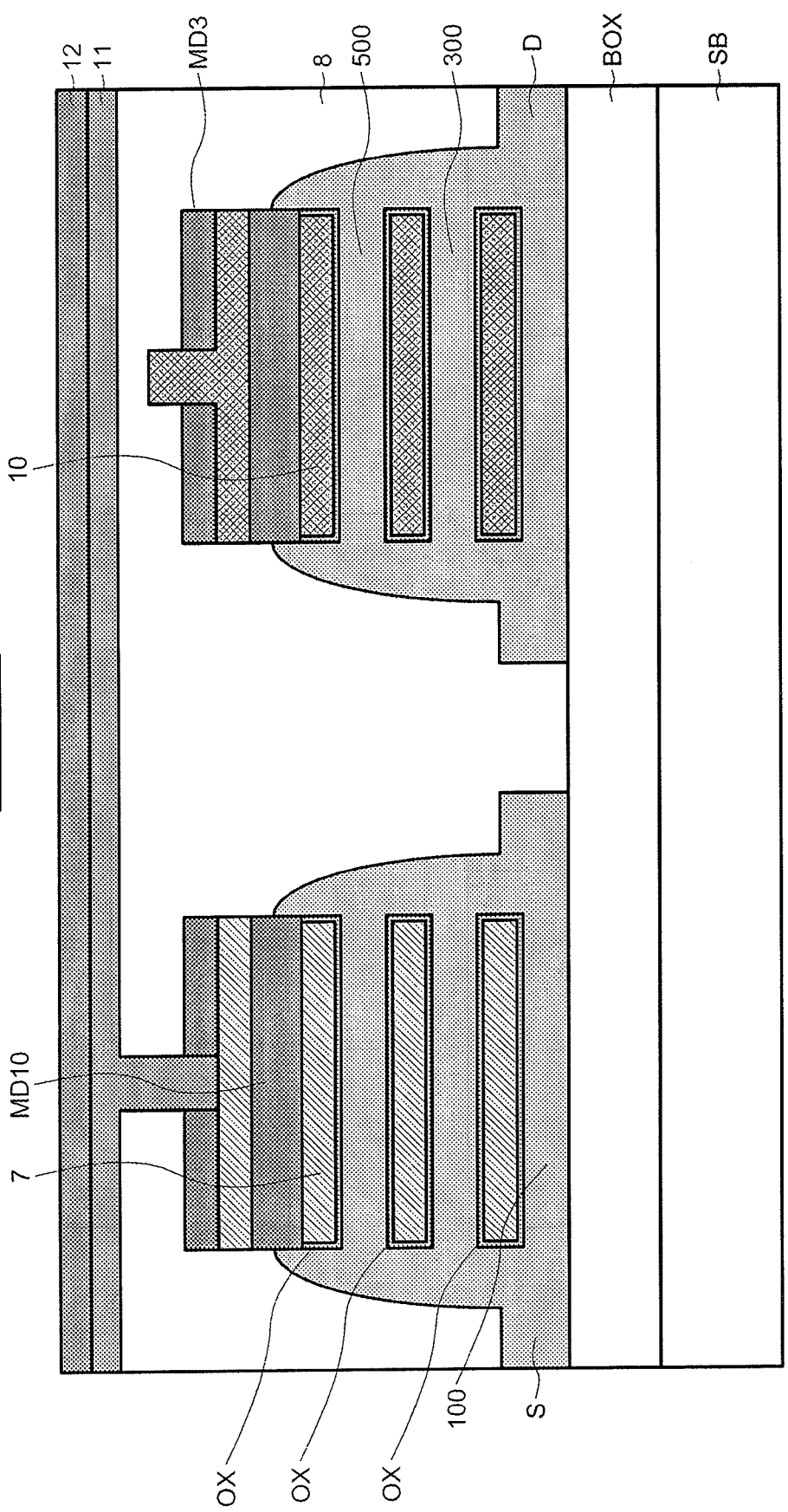
Figure 19:
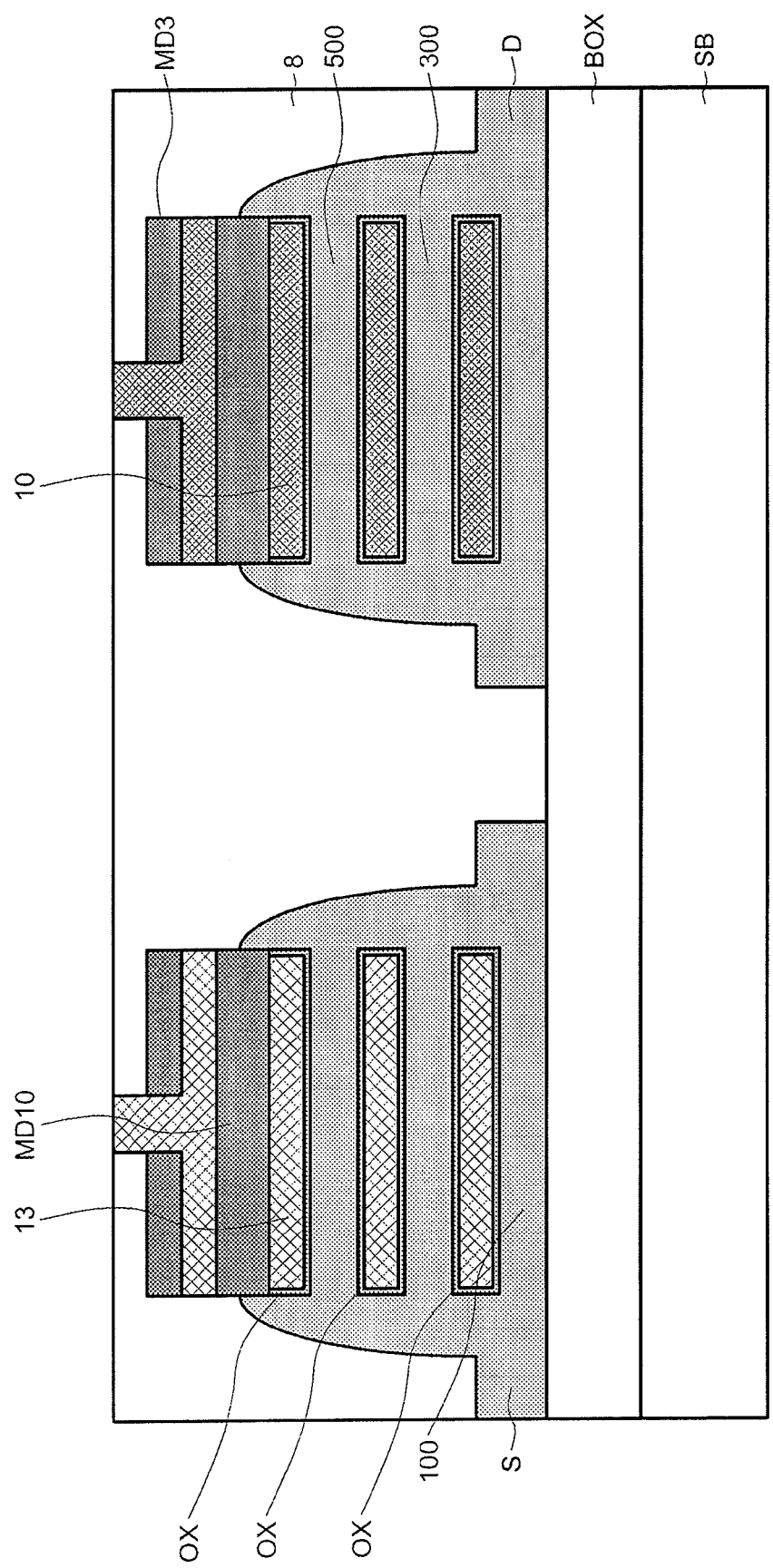

A dielectric material is then deposited in such a way that the dielectric layer 8 again covers both semiconductor devices and then trenches are formed in order to reach the layer of first material 7 of the NMOS semiconductor devices (FIG. 17) and the layer of second material 11 made of aluminum (covered by a layer of titanium 12) is deposited in contact with the said region of first material 7 (FIG. 18). A second annealing, at a temperature of about 400° C., makes it possible to form the polysilicon-germanium and thus to obtain the NMOS semiconductor devices with a gate region 13 (FIG. 19).

Figure 20:
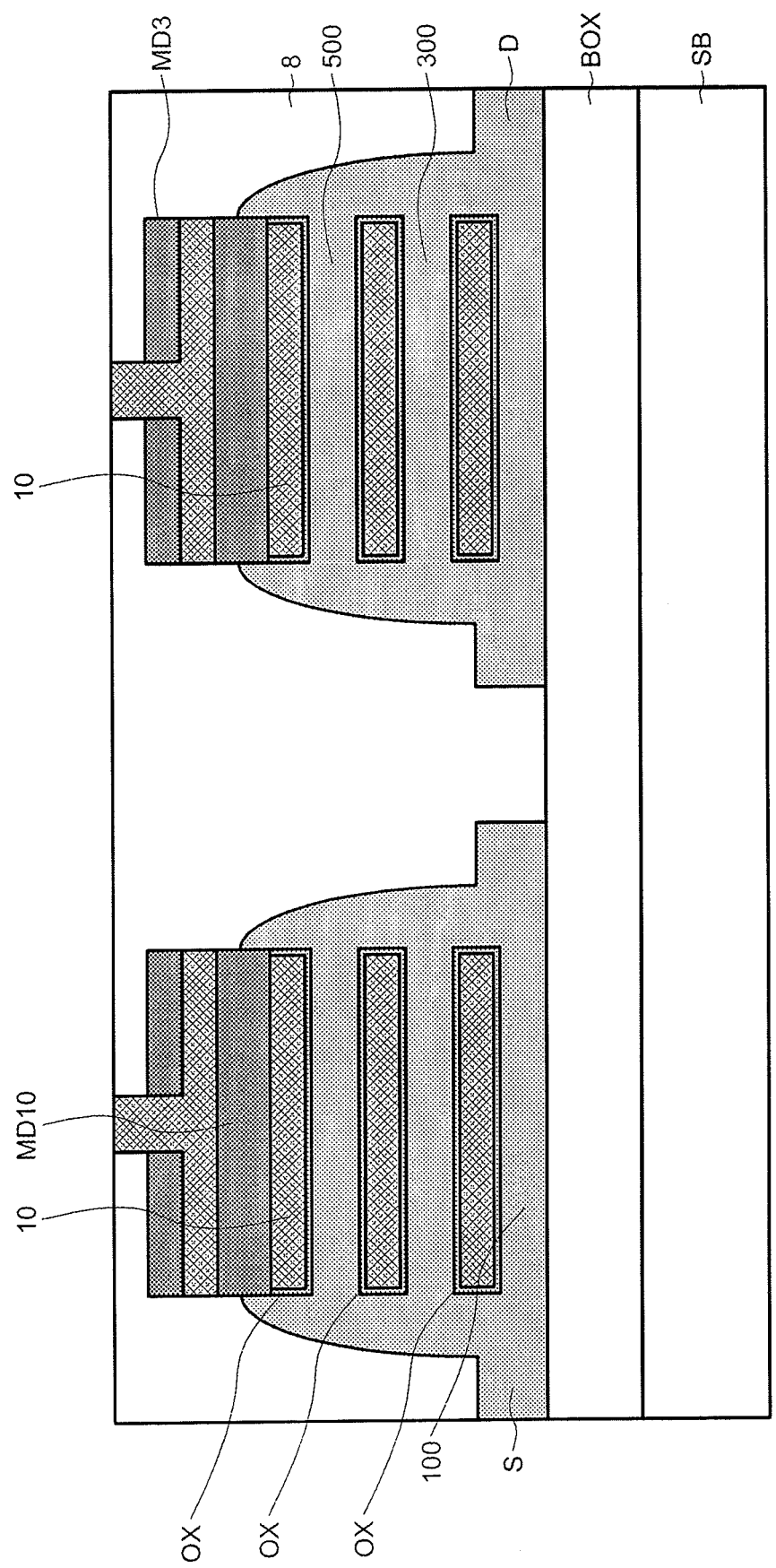
FIGS. 20 to 22 are diagrammatic partial illustrations of a variant of the third implementation.
Figure 21:
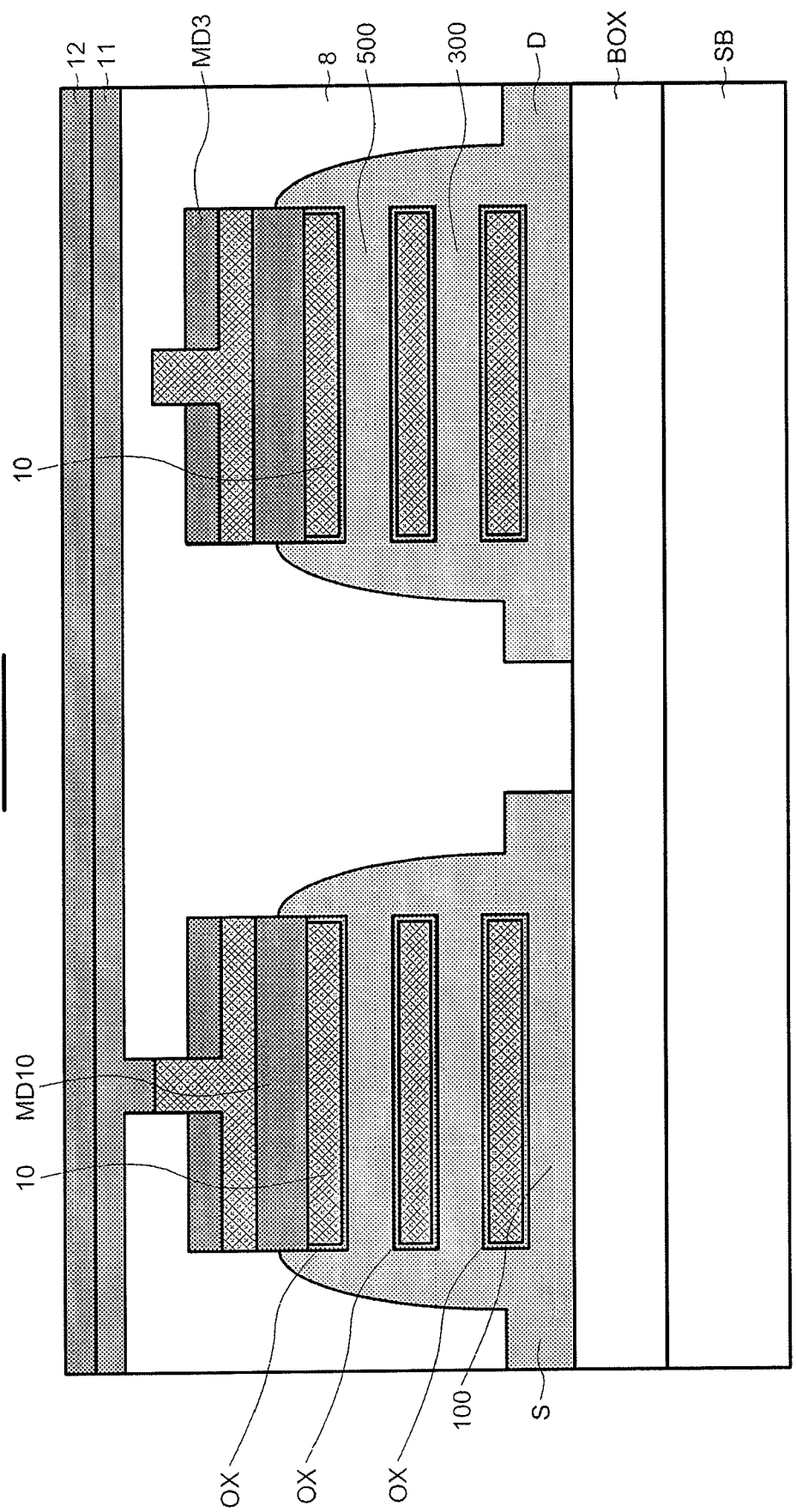
Figure 22:
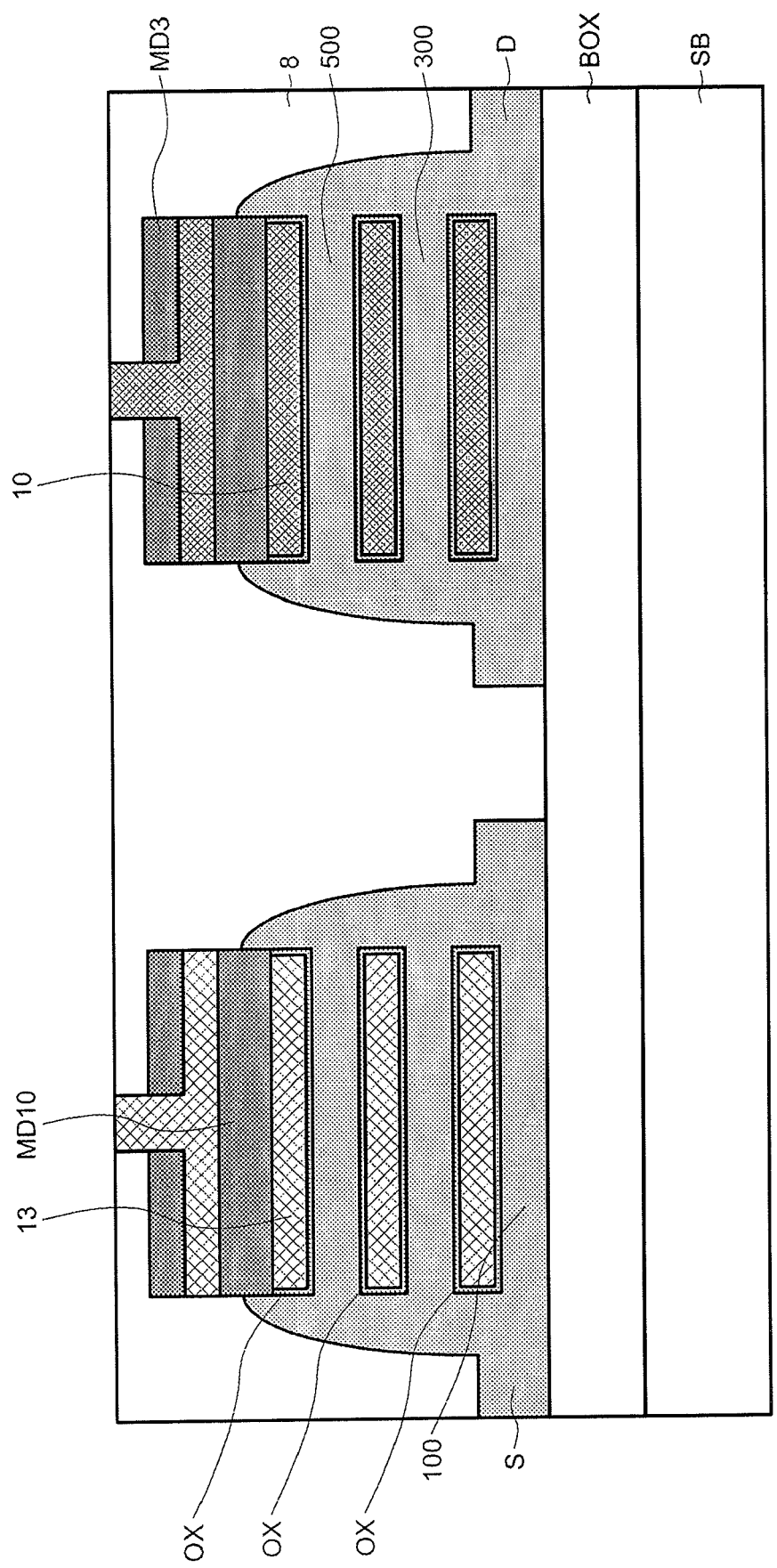

Moreover, it can be noted that the aluminum substitution step can also be carried out with a region of first material 7 comprising polysilicon-germanium. Thus, in order to produce both NMOS and PMOS semiconductor devices, it is also possible to produce only PMOS semiconductor devices using the method of diffusion of germanium in the silicon (FIG. 20). A dielectric material is then deposited such that the dielectric layer 8 again covers both semiconductor devices and then openings are formed in the dielectric layer 8 at the positions of the semiconductors which must be NMOS. A layer of aluminum 11 (covered by a layer of nitride 12) it then deposited on the dielectric layer 8 and in contact with the region of polysilicon-germanium 10 of the semiconductor devices that are required to be NMOS (FIG. 21). A substitution annealing makes it possible to form the NMOS semiconductor devices (FIG. 22).

The various methods described above thus make it possible to retain the standard production steps of semiconductor devices. In particular, the replacement of polysilicon by the gate metal at the end of the process notable avoids the problems of reactivity of the metal with the gate oxide notably during the production of the semiconductor device.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method for manufacturing a semiconductor device comprising a semiconductor channel region and a gate region, the gate region comprising at least one buried part extending under the channel region, comprising forming the buried part of the gate region by:
forming a cavity under the channel region,
filling of the cavity with a first material,
contacting the first material with one of either aluminum or a second semiconductor material different from the first material,
substituting aluminum for the first material, or forming a third material by diffusion of the second semiconductor material into the first material.

2. The method according to claim 1, wherein forming the buried part of the gate region further comprises:
contacting the third material with aluminum, and
substituting the aluminum for the third material.

3. The method according to claim 1, wherein filling of the cavity comprises a depositing the first material in the cavity, and wherein substituting or forming by diffusion comprises annealing.

4. The method according to claim 3, wherein a quantity of the first material and a quantity of the second semiconductor material in the buried part of the gate is chosen in order to adjust a threshold voltage of the semiconductor device.

5. The method according to claim 3, wherein a relative quantity of the first material and relative quantity of the second semiconductor material in the buried part of the gate is adjusted by the duration of the annealing.

6. The method according to claim 1, wherein forming the gate comprises:
forming on an upper surface of the substrate of a stack formed by at least one layer of silicon placed above a sacrificial layer formed of a material that can be eliminated selectively with respect to the silicon,
epitaxially growing silicon on lateral walls of the stack,
anisotropic etching the stack in such a way as to etch a part of the epitaxied silicon and to access at least one of the ends of the sacrificial layer,
selective isotropic etching of the sacrificial layer to form a cavity,
forming, on walls of the cavity, of a layer comprising a dielectric material,
depositing in the cavity of the first material,
depositing aluminum or the second semiconductor material in contact with the first material, and
annealing for the formation of the gate material.

7. The method according to claim 1, wherein forming of the gate region comprises depositing of the first material around the part of the semiconductor channel region in such a way that the gate region surrounds the semiconductor channel region.

8. A method of fabricating a semiconductor transistor device comprising a semiconductive channel region and a gate region, the gate region comprising at least one buried part extending under the semiconductive channel region, wherein fabricating comprises:
forming a stack comprising a layer of silicon above a sacrificial layer,
forming source/drain regions on either end of the stack,
selectively etching away the sacrificial layer from either side of the stack to form a cavity,
depositing first semiconductor material filling the cavity,
forming an access opening to reach the first semiconductor material,
depositing second semiconductor material in the access opening to be in contact with the first semiconductor material, and
annealing to form in the cavity an alloy of the first and second semiconductor material which forms the at least one buried part of the gate region.

9. The method of claim 8 wherein the transistor device is a pMOS device.

10. A method of fabricating a semiconductor transistor device comprising a semiconductive channel region and a gate region, the gate region comprising at least one buried part extending under the semiconductive channel region, wherein fabricating comprises:
forming a stack comprising a layer of silicon above a sacrificial layer,
forming source/drain regions on either end of the stack,
selectively etching away the sacrificial layer from either side of the stack to form a cavity,
depositing first semiconductor material filling the cavity,
forming an access opening to reach the first semiconductor material,
depositing aluminum in the access opening to be in contact with the first semiconductor material, and
annealing to substitute the aluminum for the first semiconductor material in the cavity which forms the at least one buried part of the gate region.

11. The method of claim 10 wherein the transistor device is an nMOS device.

12. A method of fabricating semiconductor transistor devices each comprising a semiconductive channel region and a gate region, the gate region comprising at least one buried part extending under the semiconductive channel region, wherein fabricating comprises:
at each transistor location:
forming a stack comprising a layer of silicon above a sacrificial layer,
forming source/drain regions on either end of the stack,
selectively etching away the sacrificial layer from either side of the stack to form a cavity,
depositing first semiconductor material filling the cavity,
forming an access opening to reach the first semiconductor material,
if the transistor at that location is to be of pMOS type, then:
depositing second semiconductor material in the access opening to be in contact with the first semiconductor material; and
if the transistor at that location is to be of nMOS type, then:
depositing aluminum in the access opening to be in contact with the first semiconductor material, and
annealing to form the at least one buried part of the gate region,
wherein annealing for the pMOS type transistor forms an alloy of the first and second semiconductor material in the cavity; and
wherein annealing for the nMOS type transistor causes a substitution of the aluminum for the first semiconductor material in the cavity.

13. The method of claim 12 further comprising forming a dielectric covering over the stack, and wherein forming the access opening comprises forming the access opening through the dielectric covering.

14. A method for manufacturing a semiconductor device comprising a semiconductor channel region and a gate region, the gate region comprising at least one buried part extending under the channel region, comprising forming the buried part of the gate region by:

forming a cavity under the channel region, filling of the cavity with a first material, forming an access opening to the first material;

depositing aluminum in the access opening in contact with the first material, annealing so as to substitute aluminum for the first material in the cavity and form the buried part of the gate region.

15. A method for manufacturing a semiconductor device comprising a semiconductor channel region and a gate region, the gate region comprising at least one buried part extending under the channel region, comprising forming the buried part of the gate region by:

forming a cavity under the channel region, filling of the cavity with a first material, forming an access opening to the first material;

depositing a second material in the access opening in contact with the first material, annealing so as to form an alloy of the first and second materials in the cavity and form the buried part of the gate region.

* * * * *